(12) United States Patent
Sakai et al.

(10) Patent No.: US 11,335,783 B2
(45) Date of Patent: May 17, 2022

(54) METHOD OF MAKING SEMICONDUCTOR FERROELECTRIC MEMORY ELEMENT, AND SEMICONDUCTOR FERROELECTRIC MEMORY TRANSISTOR

(71) Applicants: National Institute of Advanced Industrial Science and Technology, Tokyo (JP); WACOM R&D Corporation, Tokyo (JP)

(72) Inventors: Shigeki Sakai, IbarakI (JP); Mitsue Takahashi, Ibaraki (JP); Masaki Kusuhara, Tokyo (JP); Masayuki Toda, Tokyo (JP); Masaru Umeda, Tokyo (JP); Yoshikazu Sasaki, Tokyo (JP)

(73) Assignees: NATIONAL INSTITUTE OF ADVANCED INDUSTRIAL SCIENCE AND TECHNOLOGY, Tokyo (JP); WACOM R&D CORPORATION, Tokyo (JP)

( * ) Notice: Subject to any disclaimer, the term of this patent is extended or adjusted under 35 U.S.C. 154(b) by 0 days.

(21) Appl. No.: 16/870,308

(22) Filed: May 8, 2020

(65) Prior Publication Data
US 2020/0279927 A1    Sep. 3, 2020

Related U.S. Application Data

(62) Division of application No. 15/493,995, filed on Apr. 21, 2017, now Pat. No. 10,686,043.

(30) Foreign Application Priority Data

Apr. 22, 2016 (JP) ................ JP2016-86570

(51) Int. Cl.
*H01L 29/40* (2006.01)
*H01L 21/28* (2006.01)
(Continued)

(52) U.S. Cl.
CPC ...... *H01L 29/40111* (2019.08); *G11C 11/223* (2013.01); *H01L 21/022* (2013.01);
(Continued)

(58) Field of Classification Search
CPC ......... H01L 21/28291; H01L 21/02271; H01L 29/78391; H01L 29/513; H01L 29/516;
(Continued)

(56) References Cited

U.S. PATENT DOCUMENTS 5,618,761 A    4/1997 Eguchi et al.
6,048,740 A *  4/2000 Hsu ..................... H01L 29/6684
                                                          257/295

(Continued)

FOREIGN PATENT DOCUMENTS

CN    1689161 A    10/2005
CN    1732540 A    2/2006
(Continued)

OTHER PUBLICATIONS

The Fabrication of Hafnium Nitride by Metal Organic Chemical Vapor Deposition (MOCVD) Using TDEAHf Precursor for Gate-Electrode Application, Wenwu Wang et al., Jpn. J. Appl. Phys., vol. 43, No. 11A, 2004, pp. L 1445-L 1448 (Year: 2004).*

(Continued)

*Primary Examiner* — Charles D Garber
*Assistant Examiner* — S M Sohel Imtiaz
(74) *Attorney, Agent, or Firm* — Nixon & Vanderhye

(57) ABSTRACT

A FeFET and a method of its manufacture are provided, the FeFET having a ferroelectric whose film thickness (dr) is made small and so nanofine as to range in: 59 nm<dr<150 nm, without impairing the data retention property of not less than $10^5$ seconds and the data rewrite endurance property of not less than $10^8$ times, of those that have hitherto been developed, and the FeFET allowing a memory window of (Continued)

0.40 V or more when a sweep amplitude of the gate voltage is not more than 3.3 V.

7 Claims, 17 Drawing Sheets

(51) Int. Cl.
  *H01L 29/66* (2006.01)
  *G11C 11/22* (2006.01)
  *H01L 21/02* (2006.01)
  *H01L 29/78* (2006.01)
  *H01L 29/51* (2006.01)
  *H01L 27/1159* (2017.01)
  *H01L 29/49* (2006.01)

(52) U.S. Cl.
  CPC .. *H01L 21/02181* (2013.01); *H01L 21/02197* (2013.01); *H01L 21/02266* (2013.01); *H01L 21/02271* (2013.01); *H01L 21/02337* (2013.01); *H01L 21/02356* (2013.01); *H01L 29/513* (2013.01); *H01L 29/516* (2013.01); *H01L 29/6684* (2013.01); *H01L 29/78391* (2014.09); *H01L 27/1159* (2013.01); *H01L 29/495* (2013.01); *H01L 29/4966* (2013.01); *H01L 29/517* (2013.01); *H01L 29/518* (2013.01)

(58) Field of Classification Search
  CPC ......... H01L 21/02181; H01L 21/02197; H01L 21/02337; H01L 29/518; H01L 29/495; H01L 29/4966; H01L 27/1159; H01L 29/517
  See application file for complete search history.

(56) References Cited

U.S. PATENT DOCUMENTS

| | | | |
|---|---|---|---|
| 6,133,092 A * | 10/2000 | Hayashi | C23C 18/1216 438/256 |
| 6,151,241 A | 11/2000 | Hayashi et al. | |
| 6,153,898 A | 11/2000 | Watanabe et al. | |
| 6,185,472 B1 | 2/2001 | Onga et al. | |
| 6,441,417 B1 | 8/2002 | Zhang et al. | |
| 6,660,631 B1 | 12/2003 | Marsh | |
| 7,217,970 B2 | 5/2007 | Marsh | |
| 7,226,795 B2 | 6/2007 | Sakai | |
| 8,304,823 B2 | 11/2012 | Boescke | |
| 9,780,186 B2 | 10/2017 | Sakai et al. | |
| 2001/0012698 A1 | 8/2001 | Hayashi et al. | |
| 2001/0028582 A1 * | 10/2001 | Tarui | G11C 11/22 365/200 |
| 2002/0096737 A1 * | 7/2002 | Nakamura | H01L 21/2855 257/532 |
| 2002/0098599 A1 | 7/2002 | Takasu et al. | |
| 2002/0168785 A1 | 11/2002 | Paz De Araujo et al. | |
| 2003/0036243 A1 * | 2/2003 | Hironaka | H01L 21/02197 438/396 |
| 2003/0051324 A1 * | 3/2003 | Inomata | H04R 17/00 29/25.41 |
| 2004/0036111 A1 * | 2/2004 | Nishikawa | H01L 29/40111 257/316 |
| 2004/0057274 A1 | 3/2004 | Dimmler et al. | |
| 2004/0081003 A1 * | 4/2004 | Shimada | G11C 11/22 365/200 |
| 2005/0040516 A1 | 2/2005 | Sakashita et al. | |
| 2005/0148139 A1 | 7/2005 | Sashida | |
| 2005/0230726 A1 * | 10/2005 | Li | H01L 21/31691 257/295 |
| 2006/0017120 A1 | 1/2006 | Sakai | |
| 2006/0202263 A1 * | 9/2006 | Lee | H01L 29/7881 257/330 |
| 2007/0196986 A1 * | 8/2007 | Ichige | H01L 27/11529 438/266 |
| 2008/0017914 A1 | 1/2008 | Natori et al. | |
| 2008/0087890 A1 * | 4/2008 | Ahn | H01L 21/31604 257/43 |
| 2008/0216872 A1 | 9/2008 | Yamoto et al. | |
| 2008/0217738 A1 * | 9/2008 | Wang | H01L 27/11507 257/532 |
| 2009/0020797 A1 | 1/2009 | Wang | |
| 2012/0021138 A1 | 1/2012 | Ditizio et al. | |
| 2012/0181584 A1 | 7/2012 | Huang et al. | |
| 2012/0193759 A1 | 8/2012 | Takemura | |
| 2013/0105901 A1 | 5/2013 | Park et al. | |
| 2014/0070290 A1 * | 3/2014 | Inumiya | H01L 29/516 257/295 |
| 2015/0102342 A1 | 4/2015 | Yamazaki | |
| 2015/0171183 A1 | 6/2015 | Sakai et al. | |
| 2015/0357077 A1 | 12/2015 | Sasa et al. | |
| 2018/0006130 A1 | 1/2018 | Sakai et al. | |

FOREIGN PATENT DOCUMENTS

| | | |
|---|---|---|
| CN | 1751380 A | 3/2006 |
| JP | H08-139043 A | 5/1996 |
| JP | 2002-305289 A | 10/2002 |
| JP | 2003-243628 A | 8/2003 |
| JP | 2004-304143 A | 10/2004 |
| JP | 2007-115733 A | 5/2007 |
| JP | 2008-001994 A | 1/2008 |
| JP | 2008-219026 A | 9/2008 |
| JP | 2008-244279 A | 10/2008 |
| JP | 2012-151497 A | 8/2012 |

OTHER PUBLICATIONS

U.S. Appl. No. 15/493,995, filed Apr. 21, 2017.

Ling, H., et al., "Structure and Electrical Properties of SrBi2Ta2O9 Thin Films Annealed in Different Atmosphere," Materials Letters, vol. 49, No. 5, Jul. 2001, pp. 303-307.

Wang et al.; The Fabrication of Hafnium Nitride by Metal Organic Chemical Vapor Deposition (MOCVD) Using TDEAHf Precursor for Gate-Electrode Application; Oct. 2004; Japanese Journal of Applied Physics; vol. 43, No. 11A; pp. L1445-L1448.

Zhang et al., Electrical properties of CaxSr1—xBi2Ta2O9 ferroelectric-gate field-effect transistors,Semiconductor Science and Technology, 28, May 31, 2013, IOP Publishing, pp. 1-7.

\* cited by examiner (a)

(b)

METHOD OF MAKING SEMICONDUCTOR FERROELECTRIC MEMORY ELEMENT, AND SEMICONDUCTOR FERROELECTRIC MEMORY TRANSISTOR

TECHNOLOGICAL FIELD

The present invention relates to a method of making a semiconductor ferroelectric memory element and to a semiconductor ferroelectric memory transistor. More specifically, it relates to a semiconductor ferroelectric memory transistor operable under a reduced voltage and to a method of making such a semiconductor ferroelectric memory element.

BACKGROUND ART

A ferroelectric-gate field effect transistor (FeFET) incorporating a ferroelectric in its gate insulator has come to be attracting attention as a transistor having a memory function. While having long had the problem that its data storage time is short, in patent document 1 an FeFET is shown in which the gate laminate of electrode conductor/ferroelectric/insulator/semiconductor is comprised of: metal Pt, SBT ($SrBi_2Ta_2O_9$) as a sort of crystal of Bi layered perovskite structure, insulator Hf—Al—O and semiconductor Si, thus of: $Pt/SrBi_2Ta_2O_9/Hf$—Al—$O_2$/Si. An example of the FeFET is disclosed there in which both the on and off states of a drain current when each measured for a long period of time are continued extremely stably and the ratio of drain currents in the on state and off state after a weak reaches not less than $10^5$. In the same patent document, a good data retention property is disclosed of a FeFET composed of $Pt/SrBi_2Ta_2O_9/Hf O_2$/Si, too. Thus, it has been demonstrated by patent document 1 that a FeFET acts as a memory transistor in which data is truly retained and stored. In the same patent document, data rewrite withstand property is evaluated and it is disclosed that after rewriting $10^{12}$ times, the on time and off states read out are fully discriminated. While a reason for such good data rewrite withstand capability has not yet been clarified, it is deemed to be due to the fact that the ferroelectric is made up of crystal of Bi layer perovskite structure. In the Bi layered perovskite structure, ferroelectricity (i.e. the property that atoms are distorted according to a direction of electric field and after the electric field is removed, the distortion is left and electric polarization is not restored to zero) occurs at portions of the perovskite structure. It appears that a Bi layered oxide substance between the perovskite portions acting as a buffer layer renders a malfunction less liable to occur at an interface with another layer such as of Pt, in data rewriting, to wit, during a repetition of the reversal of electric field for writing, thus leading to the good rewrite withstand capability of a FeFET.

In patent document 2, there is disclosed a FeFET using $(Bi,Nd)_4Ti_3O_{12}$ that is a Bi layer perovskite substance, as the ferroelectric. Non-patent reference 1 discloses the use in FeFETs of $(Bi,La)_4Ti_3O_{12}$ that is a Bi layer perovskite substance, as the ferroelectric.

Patent document 3 discloses using CSBT ($Ca_xSr_{1-x}Bi_2Ta_2O_9$) as the ferroelectric of Bi layer perovskite substance, and that a FeFET composed of $Pt/Ca_xSr_{1-x}Bi_2Ta_2O_9/$Hf—Al—O/Si processes a good data retention property and a good data rewrite withstand capability.

Upon forming Bi layer perovskite on the insulator/semiconductor, annealing is performed in an oxygen atmosphere for a time period of 10 to 60 minutes to crystallize the Bi layer perovskite, thereby causing it to express the ferroelectricity. It is performed at a temperature preferably from 700 to 830 degrees Celsius, more preferably from 730 to 813 degrees C. Passing the process step of annealing is found to achieve a good data retention and a good rewrite withstand property as mentioned above. By passing the process step of annealing, an interfacial layer is formed at an interface between silicon and the insulator as shown by non-patent reference 2 to 4. Non-patent reference 3 teaches that the interfacial layer is formed mainly composed of $SiO_2$. This connotes that in annealing in an oxygen atmosphere for crystallizing the Bi layer perovskite, a silicon surface is oxidized to form the interfacial layer mainly composed of $SiO_2$. As a result of uniform formation of the interfacial layer, it contributes to development of good electrical characteristics. Non-patent reference 5 discloses an example of development of an NAND flash memory of 64 k bitts with a FeFET as a memory cell by this technique.

There are the following reports of dividing the insulator into two layers. In non-patent reference 6, a film of silicon nitride is formed on silicon and thereafter a film of $HfO_2$ is formed. In non-patent reference 7, a film of oxynitride of silicon is formed on silicon and thereafter $HfO_2$ is formed. In either case, passing the process step of annealing to crystallize the Bi layer perovskite and to develop the ferroelectricity causes an interfacial layer mainly composed of $SiO_2$ to be formed between Si and $HfO_2$. The interfacial layer may contain nitrogen as derived from the film of silicon nitride and/or the film of oxynitride of silicon but is mainly composed of $SiO_2$. The interfacial layer is formed mainly by oxidation of Si, but may be merged with the insulating layer, and may have an insulating material contained therein as an impurity. Note that while non-patent reference 7 shows the range in which the gate voltage is swept is from 1-3.3 volts to 1+3.3 volts, the data given there teaches that the ferroelectric SBT has a thickness as thick as 450 nm and is not suitable for a FeFET to be nanofined.

There is a report regarding the thickness of an interfacial layer which is inspected with a transmission electron microscope as mainly composed of $SiO_2$. Non-patent reference 2 shows that a FeFET composed of $Pt/SrBi_2Ta_2O_9/Hf$—Al—O/Si annealed in oxygen at a temperature of 800 degrees C. and for a time period of 60 minutes has an interfacial layer having a thickness of 4.4 nm. Although patent document 2 discloses that $SiO_2$ having a thickness of 2 nm to 5 nm is provided between $Hf_2$ and Si, it is not the thickness of an interfacial layer mainly composed of $SiO_2$, but is the thickness of $SiO_2$ in the insulator prior to annealing for ferroelectric crystallization. There is no mention of the thickness of an interfacial layer mainly composed of $SiO_2$ subsequent to annealing which is effected at a temperature of 700 to 800 degrees C. in an oxygen atmosphere for a time period of 30 minutes for the purposes of annealing for ferroelectric crystallization.

In patent reference 8, it is shown that annealed in oxygen at a temperature of 750 degrees C. for a time period of 30 minutes, a laminate constituted of a film of $(Bi,La)_4Ti_3O_{12}$ having a thickness of 400 nm on a film of HfO2 having a thickness of 8 nm on Si has an interfacial layer having a thickness of about 5 nm. In non-patent reference 4, it is shown that a FeFET composed of $Pt/Ca_xSr_{1-x}Bi_2Ta_2O_9/Hf$—Al—O/Si annealed in oxygen at a temperature of 778 degrees C. for a time period of 30 minutes has an interfacial layer having a thickness of 3.4 nm. In non-patent reference 6, it is shown that a gate laminate composed of $Pt/SrBi_2Ta_2O_9/HfO_2/SiN/Si$ is annealed in oxygen at a temperature of 800 degrees C. for a time period of 1 hour, forming an interfacial layer mainly composed of $SiO_2$ and having a thickness of 4 nm. Thus, annealing in oxygen at a temperature of 750 to 800 degrees C. for a time period of 30 to 60 minutes is shown to form an interfacial layer having a thickness of 3.4 nm to 5 nm. Further lowering the annealing temperature is shown to tend to decrease the thickness of an interfacial layer and to produce a FeFET whose electrical characteristics are not good. A FeFET presenting acceptable characteristics is shown to have an interfacial layer having a thickness of 3.4 nm to 5 nm.

In reducing a FeFET in size, it is required from the technique of microfining such as etching that the height of a gate laminate be reduced. As shown in patent document 1 and non-patent references 6 to 8, the thickness of a ferroelectric is commonly 400 nm or more. While in patent reference 3 Examples are almost of a film of ferroelectric $Ca_xSr_{1-x}Bi_2Ta_2$ having a thickness of 200 nm, an Example is shown in which the film thickness is 120 nm. However, the writing voltage is used which in absolute value is as high as 5 volts.

In non-patent reference 9, where a positive voltage for data writing is shown applied to the gate of an FeFET of $Pt/SrBi_2Ta_2O_9/Hf$—Al—O/Si, a diagram is discussed of voltage divisions applied to various portions of a gate and energy bands in directions of depth of the gate. Identically computed, there is derived an energy band diagram (FIG. 31) that is equivalent to that of non-patent reference 9. It is assumed that $Pt/SrBi_2Ta_2O_9$ (SBT), Hf—Al—O (HAO) and an interfacial layer (IL) mainly composed of $SiO_2$ have thicknesses of 200 nm, 7 nm and 3.5 nm, respectively. If it is then assumed that when a writing voltage is applied, an electric polarization of $P_{max}$=2.7 micro $C/cm^2$ is formed in a ferroelectric, an equivalent charge is induced on the gate electrode Pt, and a voltage of 1.20 volts is applied to the ferroelectric, a voltage of 1.06 volts to Hf—Al—O, a voltage of 2.74 volt to the interfacial layer and a surface electrostatic potential of 0.95 volt to Si. A voltage of 5.95 volts as a sum of them is applied the gate metal, Pt. The voltage $V_{il}$ of 2.74 volts applied to the interfacial layer is derived from $d_{il} P_{max}/(\varepsilon_0 k_{il})$ (=2.74 V) where $d_{il}$ is a thickness of the interfacial layer mainly composed of $SiO_2$, and $k_{il}$ is a dielectric constant of the interfacial layer, for which use is made of that of 3.9 of $SiO_2$, and $\varepsilon_0$ is the dielectric constant in vacuum. The electric polarization at writing is of a degree of 1 to 3 micro $C/cm^2$. If the polarization is greater than of 3 micro $C/cm^2$, the voltage and electric field applied to the interfacial layer are increased so that there may develop a phenomenon of injection of electrons from the semiconductor side into the gate insulator side. The addition of a phenomenon other than polarization reversal mechanism makes the operation of a FeFET very complicated.

Non-patent reference 10 discloses a FeFET of Al/PTO/Si where PTO is lead titanate in the form of a film whose thickness is 90 nm. Id-Vd characteristics of FeFET is shown which is obtained on sweeping the gate voltage between −4 volts and +4 volts and sweeping it in reciprocation between 1 2 volts and +2 volts. A data retention property with writing voltages of −4 and +4 colts is measured. It is shown that in about $10^4$ seconds, it becomes hard to discriminate an On and an Off states. There is no showing of a data retention property with writing voltages of −2 and +2 volts, nor is a result shown of rewrite withstand test. In non-patent reference 11, a Fe FET of $TiN/HfSiO/SiO_2/Si$ is reported where HfSiO is claimed to be a ferroelectric, having a thickness of 8.5 nm. A writing voltage is shown as −3 and 4 volts and, if a manner of expression of the present invention as mentioned hereinafter is followed, its absolute value is 3.5 volts.

A data retention property of up to $3 \times 10^4$ seconds is shown but there is no mention of results of rewrite withstand property.

PRIOR ART REFERENCES

Patent References

[patent document 1] JP 2004-304143 A
[patent document 2] JP 2006-108648 A
[patent Document 3] WO/2013/183547

Non-Patent References

[non-patent ref. 1] Applied Physics Letters, vol. 85, pages 399-3201, published in 2004
[non-p ref. 2] Japanese Journal of Applied Physics, vol. 43, pages 7876-7878, published in 2004
[non-p ref. 3] IEEE International Electron Devices Meeting Technical Digest, pages 915-918, published in 2004
[non-p ref. 4] Semiconductor Science and Technology, vol. 28, MS No. (pages): 085003 (7), published in 2013
[non-p ref. 5] Japanese Journal of Applied Physics, vol. 51, MS No. (pages); 04DD01 (7), published in 2012
[non-p ref. 6] Semiconductor Science and Technology, vol. 24, MS No. (pages): 105026 (5), published in 2009
[non-p ref. 7] Semiconductor Science and Technology, vol. 25, MS No. (pages): 055005 (5), published in 2009
[non-p ref. 8] Japanese Journal of Applied Physics, vol. 44, pages 6218-6220, published in 2005
[non-p ref. 9] IEEE Non-Volatile Memory Technology Symposium 2012 Proceeding, pages 55-59, published in 2013
[non-p ref. 10] Applied Physics Letters, vol. 85, pages 4726-4728, published in 2004
[non-p ref. 11] IEEE International Electron Devices Meeting Digest, pages 547-550, published in 2011

SUMMARY OF THE INVENTION

Problems to be Solved by the Invention

According to the prior art as mentioned above, as for an interfacial layer mainly composed of $SiO_2$ and having a thickness of 3.4 to 5 nm and which is formed on a Si semiconductor surface, assume that the interfacial layer has a thickness, e. g. of 3.5 nm. Then, if the ferroelectric at the time of writing has a polarization of 2.7 micro $C/cm^2$, it follows that a voltage of 2.74 volts is applied to the interfacial layer, amounting to 46% of a gate voltage of 5.95 volts. This necessarily requires the writing voltage as shown in non-patent reference 5, i.e., the operating voltage to be as high as 6 to 7 volts. While this voltage is enough lower than that of a NAND flash memory with a memory cell comprising a field effect transistor having a floating gate using a voltage of around 20 volts for writing, it is demanded that a FeFET operate at a voltage which is still more reduced to meet a diversity of needs.

Of a FeFET made in the prior art, let it be assumed that the gate voltage is swept in reciprocation in a range between −2.3 volts and +4.3 volts (i.e., in a range between 1.0–3.3 volts and 1.0+3.3 volts at a sweep amplitude of 3.3 volts). Then, the drain current is as shown in FIGS. 30 (*a*) and (*b*) from which it is seen that the memory window as a width between hysteresis curves is smaller than 0.26 volt. FIGS. 30(*a*) and (*b*) are of examples in which the films have thicknesses of 120 nm and 160 nm, respectively. FIG. 30(*c*) shows memory windows of 6 (six) FeFETs of composition $Ca_{0.2}Sr_{0.8}Bi_2Ta_2O_9$ which are of film thicknesses of 120 nm, 160 nm and 200 nm and are annealed in oxygen at temperatures of 775 and 800 degrees C. The same six FeFETs of FIG. 30(c) are measured in sweeping rages of −0.5 volt to +0.5 volt. Memory windows measured with sleep amplitudes of 3.3 and 5.0 volts are shown in FIG. 30(d). The ratio of a memory window at a sweep amplitude of 3.3 volts down to a memory window at a sweep amplitude of 5.0 volts is at most 38.8%. Thus, of a FeFET made by the prior art, a sufficient memory window is not obtainable at a sweep amplitude of 3.3 volts. In the prior art, the thickness of an interfacial layer across which a voltage is applied is as thick as 3.4 to 5 nm, which made it necessary to apply a surplus writing voltage to cause a phenomenon of electric polarization reversal to develop. Hence, with a small sweep amplitude of 3.3 volts, a sufficient and satisfactory memory window has hitherto been unobtainable.

Assuming that the thickness of an interfacial layer mainly composed of $SiO_2$ can be reduced by $\Delta$, the writing voltage can be reduced by $\Delta V_{il} = \Delta d_{il} \times P_{max}/(\varepsilon_0 k_{il})$. And, assuming that the ferroelectric polarization at writing: $P_{max}$=2.7 micro $C/cm^2$, a reduction of 1 nm of the interfacial layer can be estimated to lead to a decrease of 0.78 volt of the writing voltage. The formation and thickness of an interfacial layer may not be enough simply if the time period of annealing is reduced, and the process step of annealing must be one that is sufficient for a ferroelectric layer to develop ferroelectricity. Making a semiconductor ferroelectric memory element less than a gate length of 100 nm (or nano-fining the element) requires making a gate laminate less in thickness by photolithography or working technique. Although the thinner, the better; the thickness of a ferroelectric needs to be less than 150 nm. The lower limit of the thickness of a ferroelectric is defined as follows: The limit of electric polarization at which the aforementioned phenomenon of injection of electrons may no longer occurs at the time of writing is 3 micro $C/cm^2$. The coercive electric field $E_c$ of ferroelectric SBT ($SrBi_2Ta_2O_9$) in reciprocal sweeping between +3 micro $C/cm^2$ and −3 micro $C/cm^2$ for metal/SBT/metal is known to be about 33 kV/cm. If the film thickness necessary to obtain a memory window of 0.39 volt is defined as the lower limit in film thickness, it follows that from $V_w/(2E_c)=0.39/(2E_S)$, the lower limit of film thickness can be estimated to be 59 nm. Since $E_c$ of $Ca_xSr_{1-x}Bi_2Ta_2O_9$ is more than that of SBT, its lower limit in film thickness comes to be further lowered.

It is accordingly an object of the present invention to provide a FeFET and a method of its making, the FeFET having a ferroelectric whose film thickness (dr) is made small and so nanofine as to range in: 59 nm<dr<150, without impairing the data retention property of not less than $10^5$ seconds and the data rewrite withstand property of not less than $10^8$ times of FeFETs that have hitherto been developed, and the FeFET allowing data to be written with a writing voltage whose absolute value is not more than 3.3 volts.

Means for Solving the Problems

In order to achieve the object mentioned above, there is provided in accordance with the present invention a method of making a device comprising a semiconductor substrate, an insulator, a ferroelectric and a metal in which the insulator, a film made of constituent elements of a bismuth layer perovskite crystalline ferroelectric and the metal are sequentially formed in the indicated order on the semiconductor substrate and thereafter are subjected to annealing for ferroelectric crystallization, the method being a method of making a semiconductor ferroelectric memory element, characterized in that: the said film comprises one selected from the class which consists of a film composed of strontium, bismuth, tantalum and oxygen, a film of calcium, strontium, bismuth, tantalum and oxygen, a film of strontium, bismuth, tantalum, niobium and oxygen, and a film of calcium, strontium, bismuth, tantalum, niobium and oxygen; the said metal is composed of one selected from the class which consists of Ir, Pt, an alloy of Ir and Pt, and R; and said annealing for ferroelectric crystallization is performed in a mixed gas selected from the class which consists of one having oxygen added to nitrogen and one having oxygen added to argon.

The present invention also provides a method of making a semiconductor ferroelectric memory element as set forth above, characterized in that the said semiconductor substrate has a source and a drain region, the said semiconductor ferroelectric memory element being a transistor.

Further, according to the invention the said annealing for ferroelectric crystallization is performed preferably at a temperature of not less than 730 degrees Celsius and not more than 800 degrees Celsius.

Also, it is preferred according to the invention that the said metal be Ir, and the said mixed gas having oxygen added to nitrogen have oxygen added to nitrogen at a volume proportion of not less than 0.0002 and not more than 0.02.

Alternatively, it is also preferred according to the invention that the said metal be Pt, and the said mixed gas having oxygen added to nitrogen have oxygen added to nitrogen at a volume proportion of more than 0.0007 and not more than 0.01.

Alternatively, it is also preferred according to the invention that the said metal be an alloy of Ir and Pt alloyed at a weight proportion of 1 to 1, and the said mixed gas having oxygen added to nitrogen have oxygen added to nitrogen at a volume proportion of more than 0.0001 and not more than 0.0004.

According to the invention, the said annealing for ferroelectric crystallization is performed, preferably, under a pressure of not less than 0.001 MPa and not more than 1 atmospheric pressure. Note here that 1 atm is equal to 0.1013 Pa.

Also, the present invention provides a method of making a semiconductor ferroelectric memory element, characterized in that the said insulator is composed of a metal oxide containing at least one of metallic elements of hafnium, zirconium, lanthanum, yttrium, aluminum, magnesium and manganese and comprises a laminate of such metal oxides.

Also, the present invention provides a method of making a semiconductor ferroelectric memory element, characterized in that the said insulator is of a nitride selected from the class which consists of hafnium nitride and aluminum nitride.

Further, the present invention provides a method of making a semiconductor ferroelectric memory element, characterized in that the said insulator is selected from the class which consists of one which is composed of the said nitride and the said metal oxide and one which is constituted of a lamination of the said nitride and the said metal oxide laminate.

Further, the present invention provides a method of making a semiconductor ferroelectric memory element, characterized in that the said nitride is hafnium nitride and the said metal oxide is $HfO_2$.

According to the present invention, the said metal oxide is preferably in the form of a film of $HfO_2$ having a film thickness of not less than 1.3 nm and not more than 13 nm.

Also, the present invention provides a method of making a semiconductor ferroelectric memory element, characterized in that the said annealing for ferroelectric crystallization is followed by characteristic adjustment annealing which is at least one of annealing in an oxygen gas and annealing in a mixed gas having hydrogen mixed with nitrogen.

Further, according to the invention, annealing in the oxygen gas in the characteristic adjustment annealing is effected at an annealing temperature, preferably, of not less than 600 degrees C. and not more than 700 degrees C.

Also, according to the invention, in characteristic adjustment annealing, annealing in the mixed gas having hydrogen mixed with nitrogen is effected at an annealing temperature, preferably, of not less than 350 degrees C. and not more than 450 degrees C.

The present invention further provides a method of making a device comprising a semiconductor substrate, an insulator, a ferroelectric and a metal in which the insulator, a film made of constituent elements of a bismuth layer perovskite crystalline ferroelectric and the metal are sequentially formed in the indicated order on a semiconductor substrate and thereafter are subjected to annealing for ferroelectric crystallization, the method being a method of making a semiconductor ferroelectric memory element, characterized in that: the said film comprises one selected from the class which consists of a film composed of strontium, bismuth, tantalum and oxygen, a film of calcium, strontium, bismuth, tantalum and oxygen, a film of strontium, bismuth, tantalum, niobium and oxygen, and a film of calcium, strontium, bismuth, tantalum, niobium and oxygen; the said metal is composed of one selected from the class which consists of Ir, Pt, an alloy of Ir and Pt, and R; and the said annealing for ferroelectric crystallization is performed in an oxygen atmosphere under a pressure of not less than 10 Pa and not more than 100 Pa.

Also, the present invention provides a method of making a semiconductor ferroelectric memory element, characterized in that the said hafnium nitride is formed upon reaction between $NH_3$ gas and a complex containing Hf in a growth chamber by a metal organic chemical vapor deposition process which comprises the steps of preparing a raw material liquid solution having the complex with Hf dissolved in a solvent; dispersing the raw material liquid solution into a carrier gas to form a raw material gaseous medium in a state of gas and liquid two phases; introducing the raw material gaseous medium while in the state of gas and liquid two phases into a vaporizing chamber to form a vapor thereof and introducing the vapor into a film forming chamber.

Further, according to the invention the said complex that contains hafnium is preferably one of TEMAHF and TDEAHF.

Also, the present invention provides a semiconductor ferroelectric memory transistor, characterized in that it comprises a semiconductor substrate having a source and a drain region; and an insulator, a ferroelectric and a metal which are layered or laminated in this order on the semiconductor substrate, wherein: the said ferroelectric is one selected from the class which consists of a bismuth layer perovskite ferroelectric composed of strontium, bismuth, tantalum and oxygen, a bismuth layer perovskite ferroelectric composed of calcium, strontium, bismuth, tantalum and oxygen, a bismuth layer perovskite ferroelectric composed of strontium, bismuth, tantalum, niobium and oxygen, and a bismuth layer perovskite ferroelectric composed of calcium, strontium, bismuth, tantalum, niobium and oxygen; the said metal is one selected from the class which consists of Ir, Pt, an alloy of Ir and Pt, and Ru; and the said ferroelectric has a film thickness of more than 59 nm and less than 150 nm, the said semiconductor ferroelectric memory element being usable to write data with a writing voltage whose absolute value is not more than 3.3 volts, and having an ability to retain data for a time period of not less than $10^5$ seconds.

The present invention further provides a semiconductor ferroelectric memory transistor as set forth above, characterized in that it is capable of rewriting data not less than $10^8$ times.

The present invention still further provides a semiconductor ferroelectric memory transistor as set forth in claim 20, characterized in that an interfacial layer is formed between said semiconductor substrate and said insulator and has a thickness of less than 3.4 nm.

Effect of the Invention

In a semiconductor ferroelectric memory element having a laminated structure of an insulator, a ferroelectric and a metal formed on a semiconductor substrate, preferred conditions are selected for the metal and for the gas in which annealing is effected to crystallize the ferroelectric which adjoins the metal, to reduce the thickness of an interfacial layer mainly composed of $SiO_2$ and tending to form on surfaces of the semiconductor substrate, whereby an ferroelectric memory element and a transistor having a memory window sufficiently wide at a lower voltage are brought into reality. Furthermore, annealing for characteristic adjustment is subsequently effected to achieve a characteristic improvement such as to enlarge the change in drain current with respect to the change in gate voltage.

FORMS OF IMPLEMENTING THE INVENTION (Forms of Implementation)

Figure 1:
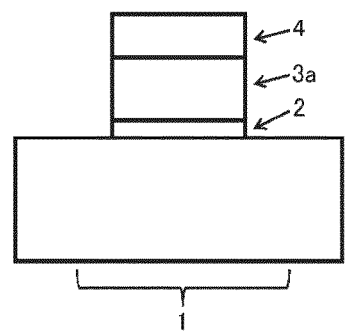
FIG. 1 It is a sectional view illustrating a step in making a semiconductor ferroelectric memory element made in a first form of implementation of the present invention.
Figure 2:
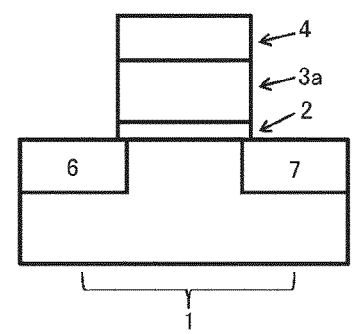
FIG. 2 It is a sectional view illustrating a step in making a semiconductor ferroelectric memory element made in a second form of implementation of the present invention.

FIG. 1 is a sectional view diagrammatically illustrating a course of making a semiconductor ferroelectric memory element made in a first form of implementation of the present invention. Numeral 1 designates a semiconductor substrate. FIG. 2 is a sectional view diagrammatically illustrating a course of making a semiconductor ferroelectric memory element made in a second form of implementation of the present invention. In the second form of implementation, a semiconductor substrate 1 is shown having a source region 6 and a drain region 7. The semiconductor substrate 1 is composed of silicon or a semiconductor having a silicon component. It may also be of a mixed crystal of Si and Ge or of SiC. In lieu of a semiconductor substrate, it may also be a SOI (silicon on insulator) substrate. Character 3a denotes a layer formed of a composition, as a ferroelectric predecessor, of constituent elements of a Bi layered perovskite crystal structure. Prior to annealing for ferroelectric crystallization, the composition has not yet be of Bi layered perovskite crystal structure. Representative are a film made of strontium, bismuth, tantalum and oxygen elements, a film of calcium, strontium, bismuth, tantalum and oxygen, a film of strontium, bismuth, tantalum, niobium and oxygen, and a film of calcium, strontium, bismuth, tantalum, niobium and oxygen. It may also be a film of bismuth, titan and oxygen, a film of bismuth, lanthanum, titanium and oxygen or a film of bismuth, neodymium, titanium and oxygen. Metal 4 may be Ir, Pt, Ru or an alloy of them.

Figure 3:
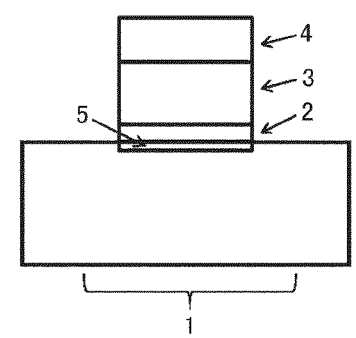
FIG. 3 It is a sectional view of the semiconductor ferroelectric memory element made in the first form of implementation of the present invention.
Figure 4:
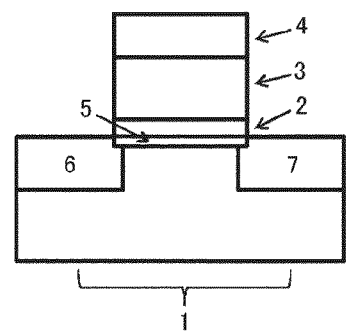
FIG. 4 It is a sectional view of the semiconductor ferroelectric memory element made in the second form of implementation of the present invention.

After up to the meal are formed, the film 3a is annealed in a suitable environment for ferroelectric crystallization. This causes its composition to transform into a ferroelectric 3. The ferroelectric 3 is composed of a material mainly constituted by a Bi layer perovskite which has been found robust in the fatigue of polarization reversal of ferroelectrics. In accordance with a composition of elements of the film, the main constituent of such perovskite may be $Sr_2Bi_2Ta_2O_9$; $Ca_xSr_{1-x}Bi_2Ta_2O_9$ as a substitute of a part of Sr with Ca in $Sr_2Bi_2Ta_2O_9$; $SrBi_2(Ta_{1-z}Nb_z)_2O_9$ and Ca in $Sr_2Bi_2Ta_2O_9$ as substitutes of parts of Ta with Nb in $Sr_2Bi_2Ta_2O_9$; $Ca_xSr_{1-x}Bi_2Ta_2O_9$ and $Ca_xSr_{1-x}Bi_2Ta_2O_9$; $Bi_4Ti_3O_{12}$; $(Bi,La)_4Ti_3O_{12}$; and $(Bi,Nd)_4Ti_3O_{12}$. $Ca_xSr_{1-x}Bi_2Ta_2$, $SrBi_2(Ta_{1-z}Nb_z)_2O_9$ and $SrBi_2(Ta_{1-z}Nb_z)_2O_9$ are similar in crystal structure and properties and may interchangeably be used. It has been found that annealing the film 3a after formation of up to the metal 4 on the substrate makes an interfacial region between the ferroelectric 3 and the metal 4 stable in quality, this being connected with and leading to excellent data retention capability and exceeding data rewriting tolerance. Upon zealous investigations in annealing to crystallize the ferroelectric, it has been found important that annealing be performed in the environment of a mixed gas having oxygen added to an inert gas such as $N_2$ or Ar. Passing through the annealing to crystallize the ferroelectric, the first form of implementation comes out whose cross section is diagrammatically shown in FIG. 3, Passing through the annealing to crystallize the ferroelectric, the second form of implementation comes out whose cross section is diagrammatically shown in FIG. 4. An interfacial layer 5 mainly composed of $SiO_2$ is formed on a surface region of the semiconductor substrate 1. The term "interfacial layer 5" may hereinafter be so simply termed, suggesting that it be so composed. While the interfacial layer 5 which is of electrical insulating properties can be defined as included in an insulator 2, it may well be regarded as a part of the semiconductor substrate in the present invention. Either way, it is only a question of definition and mode. Electrical conduction in a semiconductor occurs at an interface between the interfacial layer and the internal semiconductor.

Figure 5:
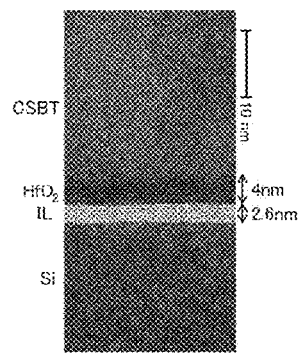
FIG. 5 It is a sectional TEM photograph of Example 02B of the invention.
Figure 6:
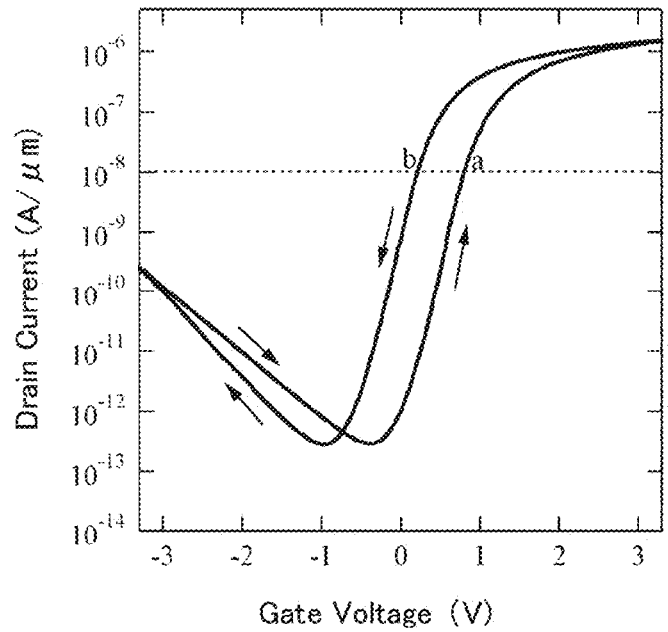
FIG. 6 It includes a graph (a) representing a relationship between a drain current and a gate voltage of a FeFET in Example 02B of the present invention and a graph (b) representing a relationship between a sweep amplitude $V_{amp}$ and a memory window.
Figure 6:
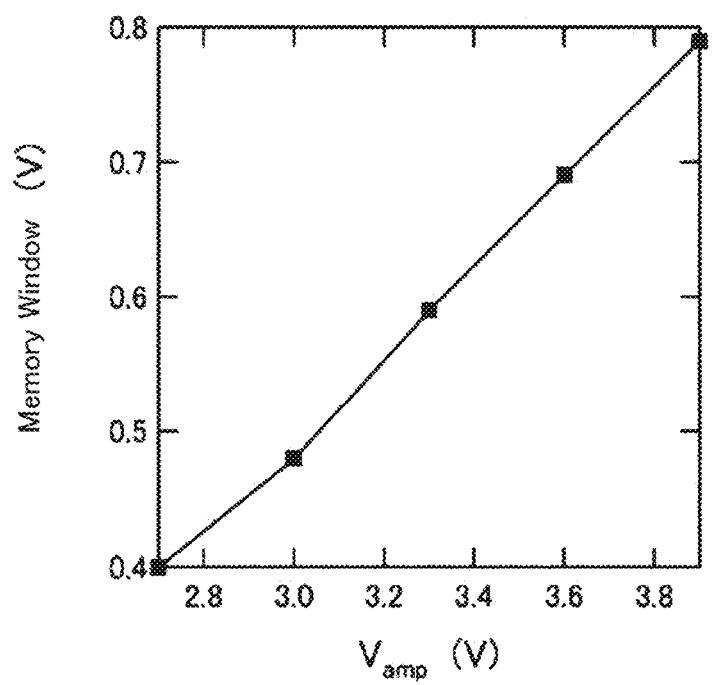
Figure 30:
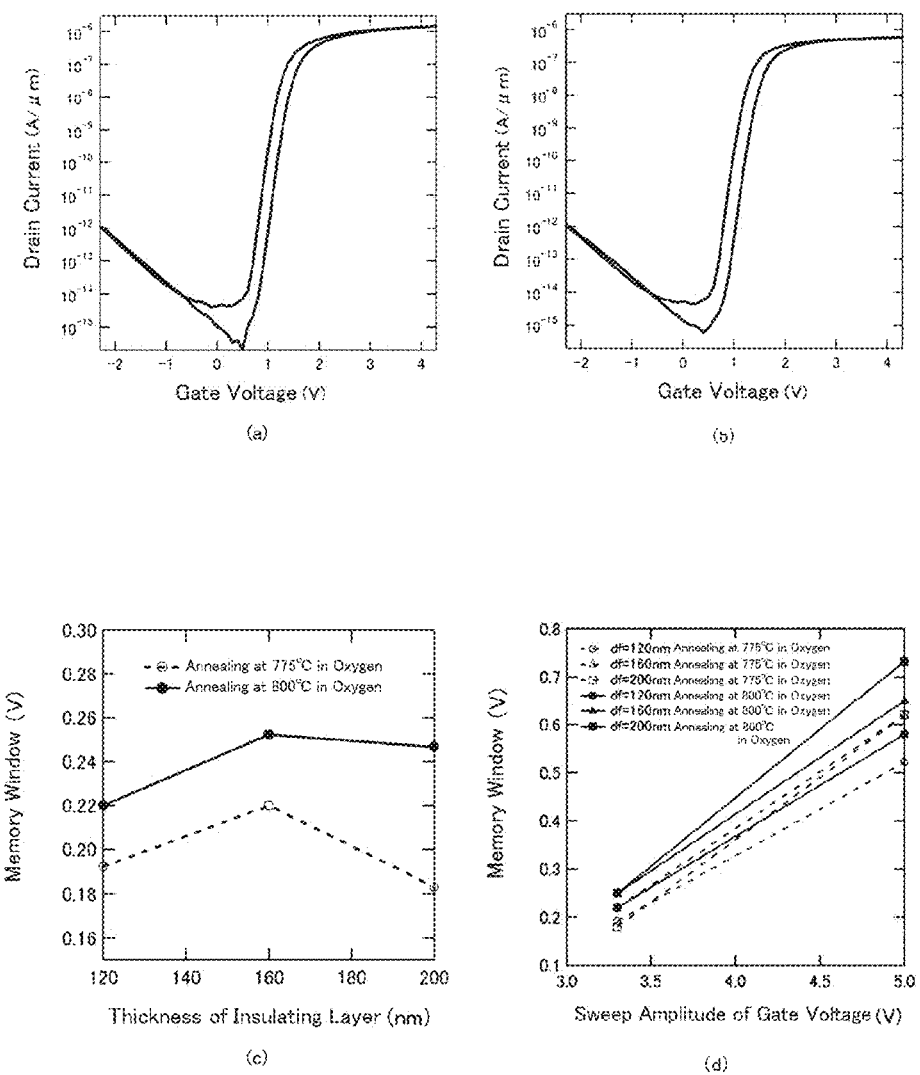
FIG. 30 It illustrates properties of FeFETs made by the prior art, including a graph (a) illustrating a relationship between a drain current and a gate voltage of a FeFET made of a ferroelectric of Ca$_{0.2}$ Sr$_{0.8}$ Bi$_2$Ta$_2$O$_9$ and having a film thickness of 120 nm, a graph (b) illustrating that of a FeFET made of a ferroelectric of Ca$_{0.2}$ Sr$_{0.8}$ Bi$_2$Ta$_2$O$_9$ and having a film thickness of 160 nm, (c) a graph illustrating a relationship between a memory window and a film thickness of prior-art FeFETs made of Ca$_{0.2}$ Sr$_{0.8}$ Bi$_2$Ta$_2$O$_9$ and of 120 nm, 160 nm and 200 nm thick in which marked by ○ and ● are ones annealed for 30 minutes at temperatures of 775 and 800 degrees C., respectively, and to obtain a memory window, a gate voltage sweep range I is set at 0.5 volts±3.3 volts, and a graph (d) illustrating a memory window with respect to a sweep amplitude of 3.3 volts and 5.0 volts.
Figure 31:
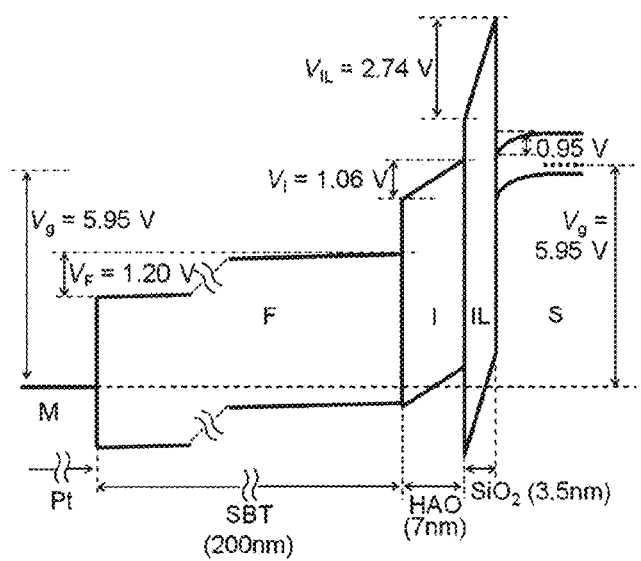
FIG. 31 It is a diagram illustrating energy and voltage divisions found depth-wise at various gate parts when a positive data rewrite voltage is applied to the gate of FeFET composed of Pt/SrBi$_2$Ta$_2$O$_9$/Hf—Al—O/Si.

An embodiment of the invention that has been annealed for the ferroelectric crystallization is analyzed using a sectional transmission electron microscope (sectional TEM) and it has been found possible that the interfacial layer 5 mainly composed of $SiO_2$ be made thinner than 3.4 nm. In Example 02B of the invention disclosed in FIG. 5, the interfacial layer 5 mainly composed of $SiO_2$ has a thickness of 2.6 nm. A layer denoted by character IL in FIG. 5 is the interfacial layer 5. A FeFET in this Example has Ir having a thickness of 75 nm, CSBT (CaSrBiTa) of x=0.2 having a thickness of 135 nm and $HfO_2$ having a thickness of 4 nm, which are formed on the semiconductor substrate. A ferroelectric of CSBT of x=0.2 signifies that the ferroelectric is mainly composed of $Ca_xSr_{1-x}Bi_2Ta_2O_9$ where x=0.2. This gate lamination is referred to briefly as Ir (75 nm)/CSBT (x=0.2, 135 nm)/$HfO_2$ (4 nm)/Si. This brief reference will hereinafter be used suitably to the extent that it brings about no confusion. The relationship between a drain current and a gate voltage: $I_d$-$V_g$ of the n channel FeFET is disclosed in FIG. 6(a). The drain current is represented in logarithm. This FeFET has a gate length (L) of 10 micro-m and a gate width of 200 micro-m. $V_g$ is swept around a center $V_c$=0 volt, with a sweep amplitude $V_{amp}$=3.3 V and in a sweep range which is $V_c$+$V_{amp}$=3.3 volts from $V_c$-$V_{amp}$=-3.3 volts. $V_g$ is swept in reciprocation between -3.3 volts and +3.3 volts. While there are Examples, too, hereafter in which measurement is made with $V_c$ that is not zero, it is ensured to achieve $V_c$=0 by suitably selecting the kind and concentration of an impurity on the side of a semiconductor in the use of such technique as ion implantation. Note that a sweep amplitude $V_{amp}$ refers to the absolute value of a data writing voltage into the FeFET. While in measurement of $I_d$-$V_g$ the sweep range may hereafter be referred to as $V_c$±Vamp, note that it signifies that $V_g$ is swept in reciprocation between $V_c$-$V_{amp}$ and $V_c$+$V_{amp}$. Along the direction of the arrows as shown, the drain current is changed. The drain current ($I_d$) as shown is normalized for a current per a gate width of 1 micro-m. In achieving this $I_d$-$V_g$ relationship, the drain voltage (Vd), source voltage ($V_s$), and substrate voltage ($V_{sub}$) are so conditioned that $V_d$=0.1 volt and $V_s$=$V_{sub}$=0 volt. Hereafter, unless otherwise indicated, an $I_d$-$V_g$ relationship is measured under such $V_d$, $V_s$ and $V_{sub}$ voltage conditions. If threshold voltages are defined as corresponding to $I_d$=1×10$^{-8}$ amperes per micro-m, in FIG. 6(a) they are seen to be gate voltages $V_a$ and $V_b$ at points (a) and (b), respectively. If a difference between them is defined as a memory window $V_w$, it is seen in FIG. 6(a) that $V_w$=$V_a$-$V_b$ is equal to 0.59 volt which apparently is wide enough compared with values of the memory window in the prior art (shown in FIG. 30). In FIG. 6(b) there is shown a relationship between a sweep amplitude and a memory window. It is shown that at $V_{amp}$=2.7 volts, =3.6 volts and =3.9 volts, Vw=0.40 volts, =0.69 volts and =079 volts, respectively. Compared with those of the prior art shown in FIG. 30d, the memory window here is markedly widened. Especially, even at a small writing voltage as $V_{amp}$=2.7 volts, it becomes apparent that $V_w$=0.40 volts. These manifest improvements are apparently due to a reduction in thickness of the interfacial layer down to a thickness of 2.6 nm which should lower the voltage applied thereto in data writing, thereby permitting an inversion in electric polarization to be initiated at a lower writing voltage.

Figure 7:
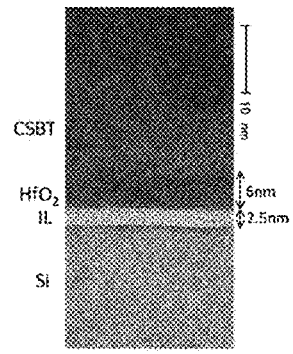
FIG. 7 It is a sectional TEM photograph of Example 21C of the invention.

In Example 21C of the invention disclosed in FIG. 7, it is found from a sectional TEM analysis that an interfacial layer 5 mainly composed of $SiO_2$ has a thickness of 2.5 nm. In this Example, on a semiconductor substrate 1 after an oxide film on its surface is removed by a buffered hydroacid fluoride, the silicon surface is oxynitrided to a depth of 1.4 nm in an environment of reduced pressure, leaving "SiON (1.4 nm thick)/Si" as it is briefly termed. The lamination or structure of layers in this Example comprises a metal layer of Ir having a thickness of 150 nm, a ferroelectric layer of CSBT where x=0.2, and an insulator layer of $HfO_2$ having a thickness of 6 nm. As disclosed in FIG. 7, the interfacial layer 5 is formed mainly composed of $SiO_2$ initially united with a layer of oxynitride of 1.4 nm thick. A layer denoted by IL in FIG. 7 is the interfacial layer 5. The thickness of the interfacial layer 5 is 2.5 nm which is sufficiently thinner than 3.4 to 5 nm in the prior art.

Figure 8:
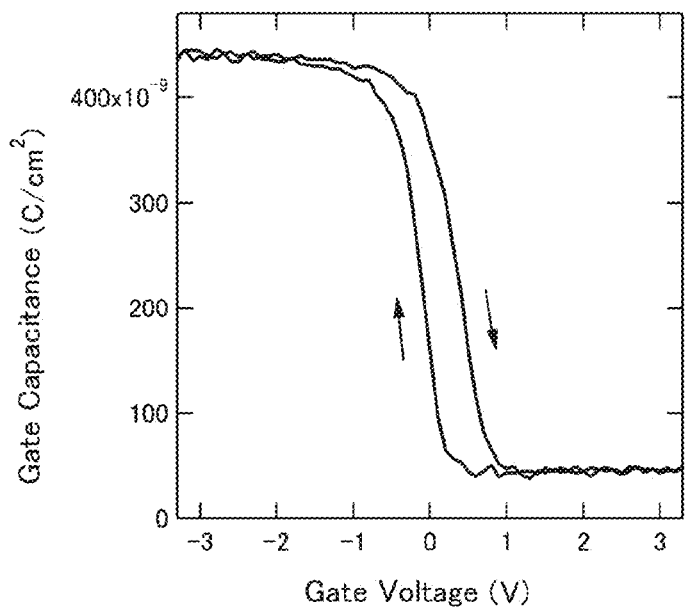
FIG. 8 It is a graphical representation of an electric capacitance with respect to a gate voltage between metal and a semiconductor substrate in Example 02A of the invention.

Example 02A represents an embodiment of the first form of implementation 1 of the present invention. The laminated gate structure comprises Ir (75 nm)/CSBT (x=0, 2.135 nm)/$HfO_2$ (4 nm)/Si. The semiconductor substrate is Si of p type. A relationship of electric capacitance with respect to gate voltage: $C_g$-$V_g$ is measured, giving a graph shown in FIG. 8. Metal Ir is planar in form and of a square having a side of 100 micro-m. The gate voltage after rising from -3.3 volts to +3.3 volts is returned to -3.3 volts. An AC voltage having an amplitude of 0.1 volts and an AC frequency of 100 kHz is used. As seen from the Figure, a memory window $V_w$ of 0.56 volts is evaluated from the $C_g$-$V_g$ curves. $V_w$ is evaluated with a gate voltage where $C_g$=100 F/cm$^2$.

Explanation is Given in Detail of Forming of the Laminated Structure.

The semiconductor substrate 1 is of silicon or of a semiconductor having a silicon component. It may be a mixed crystal of Si and Ge, or SiC. In lieu of the semiconductor substrate there may be used an SOI (silicon on insulator) substrate. Prior to attaching an insulator 2 to the semiconductor substrate, it is important that an oxide film on its surface be removed. The process step of forming the insulator 2 is effected directly upon removal of the surface oxide film, or after the semiconductor substrate surface is nitrided or oxynitrided. The nitride or oxynitride film formed has a thickness preferably of not more than 1.5 nm. Any process may be used to make it. For example, the surface oxide film is removed by immersion in a solution of buffered or unbuffered fluorinated acid. A nitride film may, for example, be formed by introducing $NH_3$ gas into an atmosphere of reduced pressure and effecting rapid thermal annealing (RTA). An oxynitride film may, for example, be formed by introducing $O_2$ gas in an atmosphere of reduced pressure and effecting rapid thermal annealing (RTA) and thereafter introducing $NH_3$ gas in an atmosphere of reduced pressure and effecting rapid thermal annealing (RTA).

Insulator 2

The insulator 2 is required to be elaborate and to diminish the leakage current between the gate and the semiconductor substrate surface. Further, in the process of making a FeFET, it is also required, not to cause inter-diffusion of, and to produce no chemical reaction product from, elements of the film 3a, the ferroelectric 3, the semiconductor substrate 1. Further, it is preferred that the insulator 2 be high in dielectric constant so that a gate voltage applied to the FeFET may effectively be applied to the ferroelectric 3. Furthermore, it is preferred that the insulator 2 should have an electron affinity (difference in energy between the vacuum level and the lowermost end of conduction bands) smaller than that of the ferroelectric 3, and further that the insulator 2 should have an ionization potential (difference in energy between vacuum level and the uppermost end of conduction bands) larger than that of the ferroelectric 3. If the electron affinity of the insulator 2 is larger than that of the ferroelectric 3, the insulator 2 between the ferroelectric 3 and the interfacial layer 5 mainly composed of $SiO_2$ on the semiconductor substrate surface tends to become a well for conductive electrons. Due to a leakage current, electrons once they enter the well are hard to come off therefrom; the well providing for a collecting place for incoming electrons. As a result, electrons are extant in the insulator 2, and if they change, the threshold voltage of the FeFET will be caused to shift by a mechanism separate from that of switching between polarizations of the ferroelectric. If the ionization potential of the insulator 2 is lower than that of the ferroelectric, the insulator 2 between the ferroelectric 3 and the interfacial layer 5 mainly composed of $SiO_2$ on the semiconductor substrate surface tends to become a well for positive holes. Due to a leakage current, positive holes once they enter the well are hard to come off therefrom; the well providing for a collecting place for incoming positive holes. As a result, positive holes are extant in the insulator 2, and if they change, the threshold voltage of the FeFET will be caused to shift by a mechanism separate from that of switching between polarizations of the ferroelectric. Note further that since the height of a barrier of $SiO_2$ as of Si for electrons is smaller than for positive holes and injection of charges from the semiconductor substrate into the insulator 2 is more prone to occur with electrons than with positive holes, it is preferred that the electron affinity of the insulator 2 should be smaller than that of the ferroelectric 3, than that the ionization potential of the insulator 2 should be higher than that of the ferroelectric 3. The insulator 2, regardless of its kinds if they satisfy these requirements, should preferably be a single oxide or mixed oxides or layered oxides of elements such as hafnium, zirconium, lanthanum, yttrium, aluminum, magnesium and/or manganese. It is also useful to achieve the object of diminishing a leakage current to add nitrogen to the oxides listed. It is also preferable to compose the insulator 2 of one or more of aluminum nitride, hafnium nitride, and mixed nitride of aluminum and hafnium, which are found to act to reduce oxygen diffusing into the ferroelectric in the process step of annealing for its crystallization and thus to reduce the extent in which to form an interfacial layer 5 mainly composed of $SiO_2$. It is preferable to use a composite compound and layered composite compounds of a nitride such as aluminum nitride, hafnium nitride, or a mixed nitride of aluminum and hafnium and an oxide as an insulator that satisfies the abovementioned requirements as to the insulator 2. In addition, a material may be used that is not an insulator prior to the process step of ferroelectric crystallization annealing and which thereafter comes to satisfy the abovementioned requirements to form the ferroelectric 2.

Since it is preferred that an interfacial layer 5 mainly composed of $SiO_2$ be thinner than 3.4 nm as mentioned above, an $SiO_2$ equivalent film thickness (EOT) of an insulator 2 be also smaller than 3.4 nm and let to stay not less than 0.2 nm and not more than 2 nm, so that a voltage may equally be applied to the interfacial layer 5 and to the insulator 2. Denoting a specific dielectric constant of the insulator 2 as kin and a dielectric constant of $SiO_2$ as $ksio_2$, it follows that the insulator has an actual film thickness of $di=(kin/ksio_2)*EOT$. Using kin=25 and k $sio_2$=3.9 if the insulator 2 is $HfO_2$, it is seen that an actual film thickness of $HfO_2$ that corresponds to the EOT that is not less than 0.2 nm and not more than 2 nm becomes not less than 1.3 nm and not more than 13 nm.

An insulator 2 may be formed by any process that meets the abovementioned requirements and may suitably be formed by pulse laser deposition, sputtering, metal organic chemical vapor deposition, atomic layer deposition or the like technique.

Film 3a

The film 3a is a film composed of elements constituting a Bi layer perovskite. Prior to a process step of crystallization annealing, the film has not yet had a Bi layer perovskite crystal structure. Representative of the film 3a are a film of elements of strontium, bismuth, tantalum and oxygen, a film of calcium, strontium, bismuth, tantalum and oxygen, a film of strontium, bismuth, tantalum, niobium and oxygen, and a film of calcium, strontium, bismuth, tantalum, niobium and oxygen, it may also be a film of bismuth, titanium and oxygen, a film of bismuth, tantalum, titanium and oxygen, or a film of bismuth, neodymium, titanium and oxygen.

The film 3a may be formed by pulse laser deposition, sputtering, or metal chemical vapor deposition, metal organic decomposition (MOD or sol-gel technique or the like.

Metal 4

The metal 4 may be selected to be a pure metal or an alloy thereof. By forming metal 4 on the film 3a and thereafter annealing the film to effect ferroelectric crystallization, there is yielded a FeFET that is excellent in data retention property and rewrite withstand property. Annealing for ferroelectric crystallization is effected preferably at a temperature of 700 to 820 degrees C. and for a time period of 10 to 60 minutes. A material is thus called for to meet the annealing conditions, After zealous investigations, it has been found that Ir, Pt, or an alloy of Ir and Pt, or Ru is suitable.

While there is no particular limitation in how metal 4 is formed, it may be formed, for example, by sputtering, metal organic chemical vapor deposition or electron beam vapor deposition technique.

Annealing for Ferroelectric Crystallization

After metal 4 is formed, annealing for ferroelectric crystallization is effected in a suitable temperature environment. This will transform the film 3a into a ferroelectric 3. The ferroelectric 3 is constituted by a material mainly composed of a Bi layered perovskite that is found robust in fatigue of ferroelectric polarization reversal. According to a composition of elements of the film 3a, its main component may be $Sr_2Bi_2Ta_2O_9$; $Ca_xSr_{1-x}Bi_2Ta_2O_9$ as a substitute of a part of Sr with Ca in $Sr_2Bi_2Ta_2O_9$; $SrBi_2(Ta_{1-z}Nb_z)_2O_9$ and Ca in $Sr_2Bi_2Ta_2O_9$ as substitutes of parts of Ta with Nb in $Sr_2Bi_2Ta_2O_9$; $Ca_xSr_{1-x}Bi_2Ta_2O_9$ and $Ca_xSr_{1-x}Bi_2Ta_2O_9$; $Bi_4Ti_3O_{12}$; $(Bi,La)_4Ti_3O_{12}$; and $(Bi,Nd)_4Ti_3O_{12}$. It has been found that annealing after formation of up to the metal 4 makes an interfacial region between the ferroelectric 3 and the metal 4 stable in quality, this being connected with and leading to excellent data retention capability and exceeding data rewriting tolerance. Upon zealous investigations, in annealing to crystallize the ferroelectric it has been found important that it be performed in the environment of a mixed gas having oxygen added to an inert gas such as $N_2$ or Ar. It has been confirmed by an X-ray analysis process that the ferroelectric 3 which has undergone annealing for ferroelectric crystallization has a Bi layered perovskite crystal structure. The ferroelectric should have a thickness df preferably such that 59 nm<d<150 nm. More specifically, to lessen forming an interfacial layer 5 mainly composed of $SiO_2$, it is important that oxygen as a component of the gaseous atmosphere used in annealing for ferroelectric crystallization should be reduced as much as possible in nitrogen or argon as its main component. At the same time, in order to transform the film 3a into a ferroelectric 3 of Bi layer perovskite, the ferroelectric being an oxide requires that there exist a degree of oxygen in the atmospheric gas. It is further necessary that metal 4 should withstand the annealing. With Ir, Pt, an alloy of Ir and Pt, and Ru there are available suitable amounts, respectively, of oxygen gas.

Figure 9:
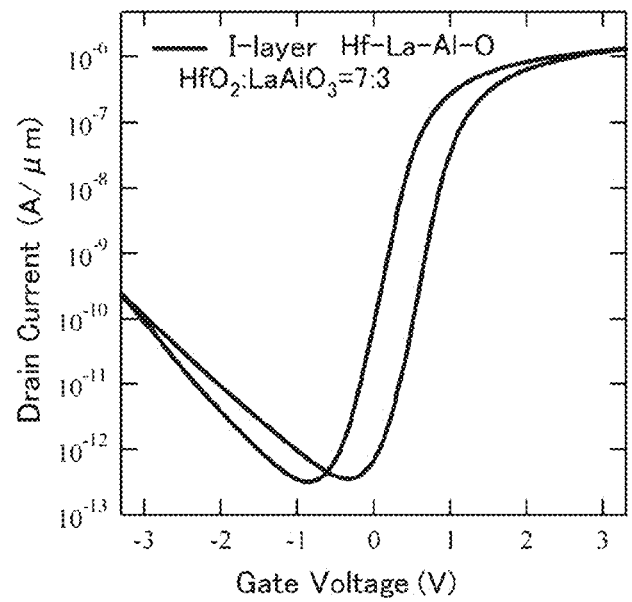
FIG. 9 It shows a relationship between a drain current and a gate voltage in Example 26C of the invention in which the gate lamination has a structure and a thickness of Ir (75 nm)/CSBT (x=0.2, 135 nm)/Hf—La—Al—O (5 nm)/Si, having the insulator 5 (I layer) of a composition ratio of $HfO_2:LaAlO_3=7:3$.
Figure 10:
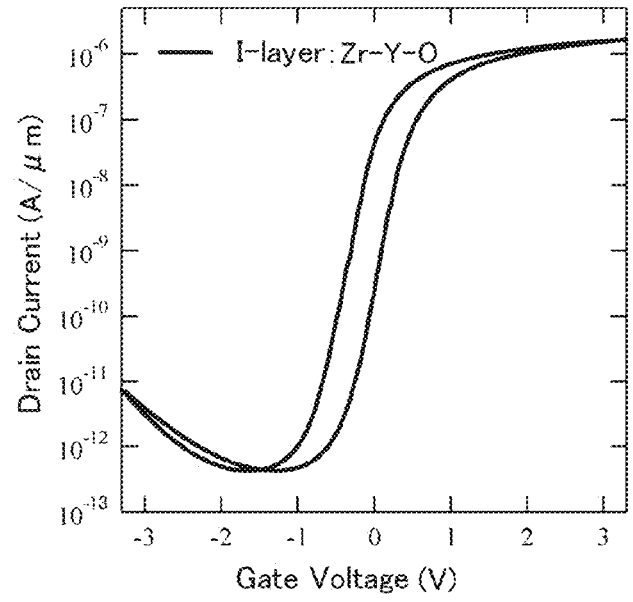
FIG. 10 It is a graph illustrating a relationship between a drain current and a gate voltage in Example 16A of the invention in which the gate lamination has a structure and a thickness of Ir (75 nm)/CSBT (x=0.25, 135 nm)/Zr—Y—O (5 nm)/Si, having the insulator 5 (I layer) of Zr—Y—O.
Figure 11:
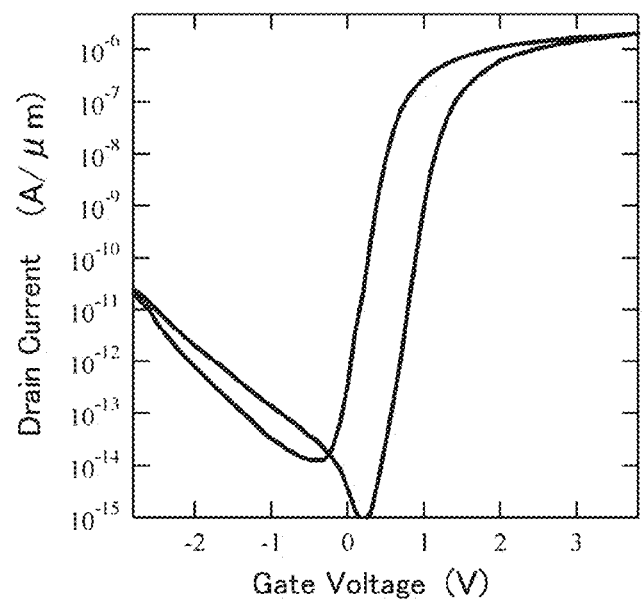
FIG. 11 It is a graph illustrating a relationship between a drain current and a gate voltage in Example 302B of the invention in which the gate lamination has a structure and a thickness of Ir (75 nm)/CSBT (x=0.2, 135 nm)/HfO$_2$ (4 nm)/Si.

Forming of the laminated structure is disclosed below in detail through Examples of the invention. In Example 26C, the insulator 2 is of a composite oxide of hafnium, lanthanum and aluminum: (Hf—La—Al—O), having a makeup molar ratio, $HfO_2:LaAlO_3=7:3$. The structure and thickness of a gate laminate are: Ir (75 nm)/CSBT (x=0.2, 135 nm)/Hf—La—Al—O (5 nm)/Si. In an atmosphere having oxygen mixed with $N_2$ (the volume ratio of $N_2$ to $O_2$ being 1:0.001), annealing for ferroelectric crystallization is effected at a temperature of 760 degrees C. and for a time period of 30 minutes. FIG. 9 is a result of measurement of $I_d$-$V_g$. With a gate voltage that is swept in a range from −3.3 volts to +3.3 volts there is observed a memory window: $V_w$=0.49 volts. In Example 16A, the insulator 2 is of a composite oxide of zirconium and yttrium: (Zr—Y—O), having a makeup molar ratio, $ZrO_2:Y_2O_3=92:8$. The structure and thickness of a gate laminate are: Ir (75 nm)/CSBT (x=0.25, 135 nm)/Zr—Y—O (5 nm)/Si. In an atmosphere having oxygen mixed with $N_2$ (the volume ratio of $N_2$ to $O_2$ being 1:0.001), annealing for ferroelectric crystallization is effected at a temperature of 760 degrees C. and for a time period of 30 minutes. FIG. 10 is a result of measurement of $I_d$-$V_g$. With a gate voltage that is swept in a range from −3.3 volts to +3.3 volts there is observed a memory window: $V_w$=0.37 volts. In Example 302B, the insulator 2 is of $HfO_2$. The structure and thickness of a gate laminate are: Ir (75 nm)/CSBT (x=0.2, 135 nm)/Hf $O_2$— (4 nm)/Si. In an atmosphere having oxygen mixed with $N_2$ (the volume ratio of $N_2$ to $O_2$ being 1:0.001), annealing for ferroelectric crystallization is effected at a temperature of 750 degrees C. and for a time period of 30 minutes. FIG. 11 is a result of measurement of $I_d$-$V_g$. With a gate voltage that is swept in a range from 0.5-3.3 volts to 0.5+3.3 volts there is observed a memory window: $V_w$=0.64 volts. In Example 20C, the ferroelectric contains Nb. The structure and thickness of a gate laminate are: Ir (75 nm)/$Ca_{0.2}$ $Sr_{0.8}$ $Bi_2$ $(Ta_{0.75}$ $Nb_{0.25})_2$ $O_9$ (135 nm)/Hf $O_2$ (5 nm)/Si. In an atmosphere having oxygen mixed with $N_2$ (the volume ratio of $N_2$ to $O_2$ being 1:0.001), annealing for ferroelectric crystallization is effected at a temperature of 793 degrees C. and for a time period of 30 minutes. With a gate voltage that is swept in a range from −3.3 volts to +3.3 volts there is observed a memory window: $V_w$=0.28 volts.

Figure 12:
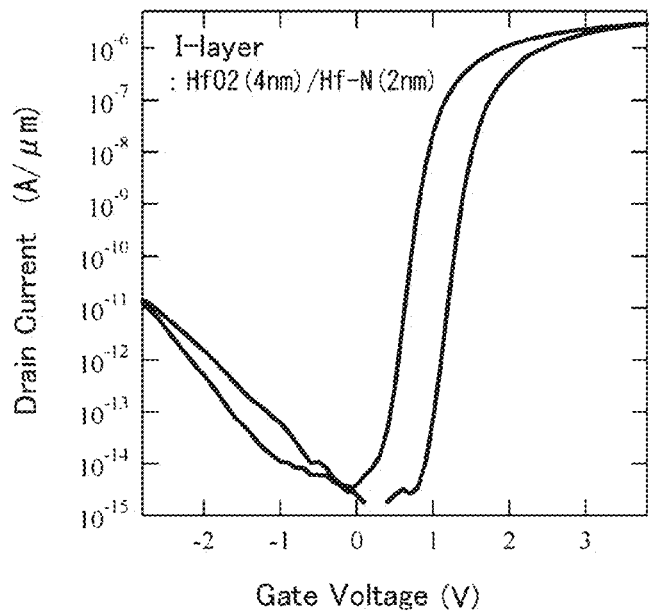
FIG. 12 It is a graph illustrating a relationship between a drain current and a gate voltage in Example 12B of the invention in which the gate lamination has a structure and a thickness of Ir (75 nm)/CSBT (x=0.2, 135 nm)/HfO$_2$ (4 nm)/Si.

In Example 12B, the insulator 2 is a laminated film having a layer of hafnium nitride having a thickness of 2 nm deposited on Si and a layer of $HfO_2$ having a thickness of 4 nm deposited on the Hf—N layer. The structure and thickness of a gate laminate are: Ir (75 nm)/CSBT (x=0.2, 135 nm)/$HfO_2$ (4 nm)/Hf—N (2 nm)/Si. In an atmosphere having oxygen mixed with $N_2$ (the volume ratio of $N_2$ to $O_2$ being 1:0.001), annealing for ferroelectric crystallization is effected at a temperature of 780 degrees C. and for a time period of 30 minutes. FIG. 12 is a result of measurement of $I_d$-$V_g$. With a gate voltage that is swept in a range from 0.5-3.3 volts to 0.5+3.3 volts there is observed a memory window: $V_w$=0.57 volts. In Example 25C, the insulator 2 is a laminated film having a layer of hafnium nitride having a thickness of 2 nm deposited on Si and a layer of $HfO_2$ having a thickness of 4 nm deposited on the Hf—N layer. The structure and thickness of a gate laminate are: Ir (75 nm)/CSBT (x=0.2, 135 nm)/$HfO_2$ (4 nm)/Al—N (2 nm)/Si. In an atmosphere having oxygen mixed with $N_2$ (the volume ratio of $N_2$ to $O_2$ being 1:0.001), annealing for ferroelectric crystallization is effected at a temperature of 780 degrees C. and for a time period of 30 minutes. A result of measurement of $I_d$-$V_g$: with a gate voltage that is swept in a range from −3.3 volts to +3.3 volts there is observed a memory window: $V_w$=0.52 volts. In Example 18C, the insulator 2 is a layer of hafnium nitride having a thickness of 5 nm. The structure and thickness of a gate laminate are: Ir (75 nm)/CSBT (x=0.2, 135 nm)/Hf—N (4 nm)/Si. In an atmosphere having oxygen mixed with $N_2$ (the volume ratio of $N_2$ to $O_2$ being 1:0.0006), annealing for ferroelectric crystallization is effected at a temperature of 750 degrees C. and for a time period of 30 minutes. A result of measurement of $I_d$-$V_g$: with a gate voltage that is swept in a range from −3.3 volts to +3.3 volts there is observed a memory window: $V_w$=0.39 volts. Example 402A is an Example in which use is made of CSBT of x=0.3. The structure and thickness of a gate laminate are: Ir (75 nm)/CSBT (x=0.3, 135 nm)/Hf $O_2$— (5 nm)/Si. In an atmosphere having oxygen mixed with $N_2$, annealing for ferroelectric crystallization is effected at a temperature of 793 degrees C. and for a time period of 30 minutes. A result of measurement of $I_d$-$V_g$: with a gate voltage that is swept in a range from −3.3 volts to +3.3 volts there is observed a memory window: $V_w$=0.42 volts.

Results of Examples in which likewise in Example 12B, the insulator 2 is a laminated film formed of a layer of hafnium nitride (Hf—N) deposited on Si and a layer of $HfO_2$ deposited on the Hf—N layer are put together in Table 1. The gate laminate is structured commonly of Ir/CSBT (x=0.2)/$HfO_2$/Hf—N/Si. The memory window of $I_d$-$V_g$ characteristic has values found with a gate voltage swept from $V_c$−3.3 volts to $V_c$+3.3 volts. Hf—N is formed by a metal organic chemical vapor deposition (MOCVD) technique.

Making conditions becoming a key to the MOCVD technique respectively for the Examples are listed in Table 1. The flow of $NH_3$ should preferably be not less than 9 sccm and not more than 20 sccm. Ranging it so is found to achieve a memory window of not less than 0.4 volt. Also, the susceptor temperature should preferably be not less than 260 degrees C. and not more than 400 degrees C. Hf—N should have a thickness of not less than 1 nm and not more than 3.1 nm. The result of sectional TEM analysis indicates that the thickness of an interfacial layer mainly composed of $SiO_2$ in Example 11A is 3.1 nm.

Figure 13:
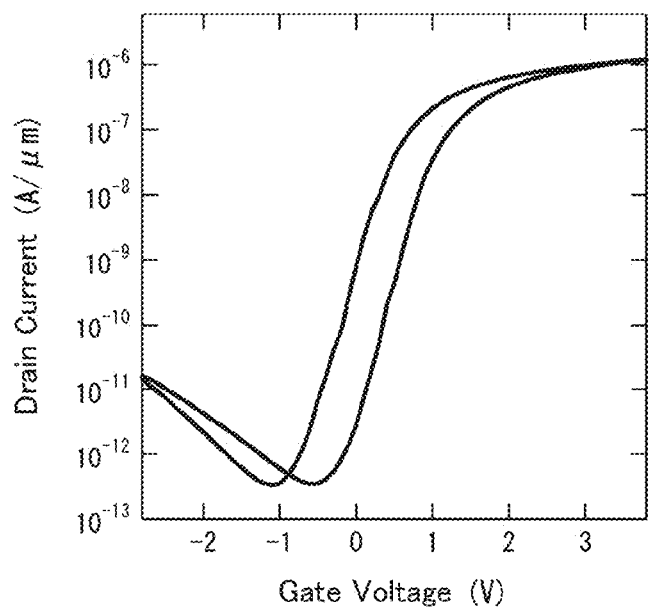
FIG. 13 It is a graph illustrating a relationship between a drain current and a gate voltage in Example 09F of the invention in which the gate lamination has a structure and a thickness of Ir (75 nm)/CSBT (x=0.15, 120 nm)/HfO$_2$ (5 nm)/Si.

In Examples 02B, 21C, 02A, 26C, 16A, 302B and 12B, a film of Ir as metal 4 is formed by a sputtering technique and a film 3a by a pulse laser deposition technique. Of the insulator 2, hafnium nitride and aluminum nitride are formed by a metal organic chemical vapor deposition technique, and other materials by the pulse laser deposition technique. In Example 09F, the film 3a is made by the metal organic chemical vapor deposition technique. CSBT as the ferroelectric 3 has a thickness of 120 nm and has a Ca composition x where x=0.15. The structure and thickness of a gate laminate are Ir (75 nm)/CSBT (x=0.15, 120 nm)/$HfO_2$ (5 nm)/Si. In an atmosphere having oxygen mixed with $N_2$ (the volume ratio of $N_2$ to $O_2$ being 1:0.00026, annealing for ferroelectric crystallization is effected at a temperature of 780 degrees C. and for a time period of 30 minutes. FIG. 13 is a result of measurement of $I_d$-$V_g$. With a gate voltage that is swept in a range from 0.5-3.3 volts to 0.5+3.3 volts there is observed a memory window: $V_w$=0.51 volts. In Example 09F, Ir and $HfO_2$ are formed by the sputtering and pulse laser deposition techniques, respectively.

Figure 14:
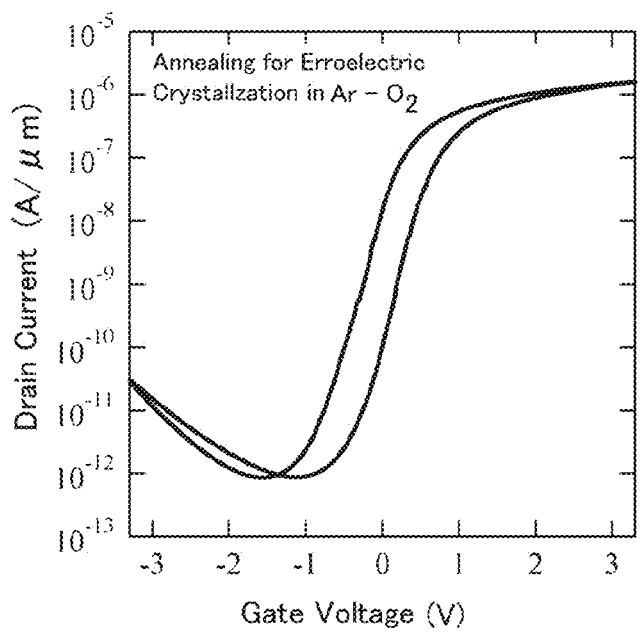
FIG. 14 It is a graph illustrating a relationship between a drain current and a gate voltage in Example 03C of the invention in which the gate lamination has a structure and a thickness of Ir (75 nm)/CSBT (x=0.2, 135 nm)/Hf—Mg—O (5 nm)/Si. Annealing for crystallization is performed in Ar—O$_2$.

Annealing for ferroelectric crystallization may be carried out in an atmosphere having oxygen mixed with an inert gas. In Example 030C, The insulator 2 is of a composite oxide of hafnium and magnesium (Hf—Mg—O), having a makeup molar ratio of $HfO_2$:MgO=7:3. The structure and thickness of a gate laminate are Ir (75 nm)/CSBT (x=0.2, 135 nm)/Hf—Mg—O (5 nm)/Si. In an atmosphere having oxygen mixed with Ar (the volume ratio of Ar to $O_2$ being 1:0.001), annealing for ferroelectric crystallization is effected at a temperature of 760 degrees C. and for a time period of 30 minutes. FIG. 14 is a result of measurement of $I_d$-$V_g$. With a gate voltage that is swept in a range from −3.3 volts to +3.3 volts there is observed a memory window: $V_w$=0.44 volts.

Figure 15:
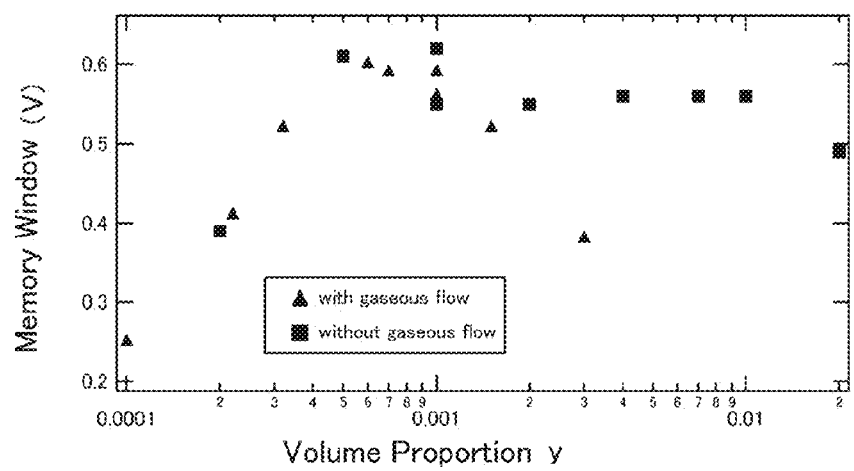
FIG. 15 It is a graph illustrating a relationship between a volume proportion of O$_2$ to N$_2$ in annealing for ferroelectric crystallization and a memory window of I$_d$-V$_g$ characteristic in an embodiment of FeFET made using the volume proportion and metal 4 of Ir, according to the present invention.

For annealing to crystallize a ferroelectric, investigations have been made in detail of the atmosphere having oxygen gas $O_2$ mixed with $N_2$ gas, the temperature and the pressure. First, with Ir used for metal 4 there has been found a relationship, as shown in FIG. 15, of a volume proportion y of $N_2$ to $O_2$ with respect to a memory window in an $I_d$-$V_g$ characteristic measured, of a FeFET made using the volume proportion. The memory window as a variable along the ordinate axis has values with the gate voltage that is swept in the rage of −3.3 volts to +3.3 volts. The abscissa axis has a variable y representing a volume proportion of $O_2$ to $N_2$, viz. that y=(volume of $O_2$ in the mixed gas)/(volume of $N_2$ in the mixed gas). The marks in FIG. 15 individually represent embodiments of FeFET made. Commonly to all embodiments in FIG. 15, The structure and thickness of a gate laminate are Ir (75 nm)/CSBT (x=0.2, 135 nm)/$HfO_2$ (4 nm)/Si, and the temperature and the time period of annealing to crystallize the ferroelectric are 780 degrees C. and 30 minutes, respectively. Ir and is formed by the sputtering technique, and CSBT and $HfO_2$ are formed by the pulse laser deposition technique. After the annealing vessel is once evacuated to a vacuum, the gases are added at a selected proportion of mixture for ferroelectric crystallization annealing. Embodiments indicated by marks (▲) in FIG. 15 are the case that annealing is effected in the presence of a flow of nitrogen and oxygen gases. More specifically, the flows of $N_2$ and $O_2$ are 1000 and 1000 y, respectively. Embodiments of marks (■) are the case that annealing is effected in the absence of the flow of nitrogen and oxygen gases. It has been found that favorable conditions to obtain good window are represented by a volume proportion of the gases, regardless of the presence or absence of the gases flowing. With Ir selected for metal 4, a preferred volume proportion of oxygen is not less than 0.0002 and not more than 0.02, achieving a memory window of not less than 0.4 volts.

In other embodiments, too, in which an FeFET is made of Ca composition X, a good memory window is achieved, regardless of presence or absence of gases flowing. In Example 24A, x=0.25, and the gate laminate is of Ir (75 nm)/CSBT (x=0.25, 135)/$Hf_2$ (4 nm)/Si. Annealing for ferroelectric crystallization is performed under conditions of without gases flowing, y=0.01, 780 degrees C. and 30 minutes, yielding a memory window of 0.51 volts with the gate voltage that is swept in a rage from −3.3 volts to +3.3 volts. In Example 24B, x=0.25, and the gate laminate is of Ir (75 nm)/CSBT (x=0.25, 135)/$HfO_2$ (4 nm)/Si. Annealing for ferroelectric crystallization is performed under conditions of in the presence of gases flowing, y=0.01, 780 degrees C. and 30 minutes, yielding a memory window of 0.51 volts with the gate voltage that is swept in a rage from −3.3 volts to +3.3 volts. In Example 24B, x=0.25, and the gate laminate is of Ir (75 nm)/CSBT (x=0.25, 135)/$HfO_2$ (4 nm)/Si. Annealing for ferroelectric crystallization is performed under conditions of in the presence of gases flowing, y=0.01, 780 degrees C. and 30 minutes, yielding a memory window of 0.48 volts with the gate voltage that is swept in a rage from −3.3 volts to +3.3 volts.

Figure 16:
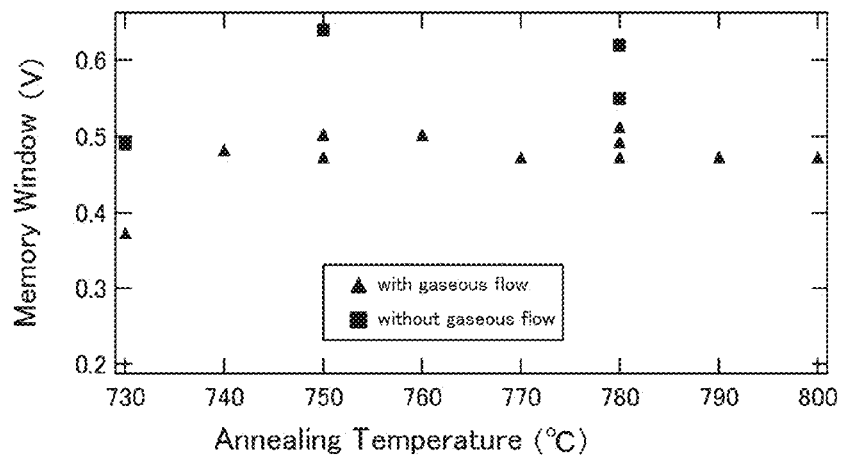
FIG. 16 It is a graph illustrating a relationship between an annealing temperature of the process of annealing for ferroelectric crystallization and a memory window of I$_d$-V$_g$ characteristic of a FeFET made according to the present invention.

FIG. 16 is a graph illustrating a relationship between an annealing temperature in the process step of annealing for ferroelectric crystallization and a memory window in $I_d$-$V_g$ characteristic of a FeFET made. The memory window as a variable along the ordinate axis has values with the gate voltage that is swept in the rage of −3.3 volts to +3.3 volts. The time period for annealing is 30 minutes. The marks in FIG. 16 individually represent embodiments of FeFET made. Embodiments indicated by marks (▲) in FIG. 16 are the case that annealing is effected in the presence of a flow of nitrogen and oxygen gases. More specifically, the flows of $N_2$ and $O_2$ are 1000 and 1, respectively. Embodiments of marks (■) are the case that annealing is effected in the absence of the flow of nitrogen and oxygen gases. In the embodiments marked with (▲), the structure and thickness of a gate laminate are of Ir (75 nm)/CSBT (x=0.2, 135 nm)/$HfO_2$ (5 nm)/Si. The structure and thickness of a gate laminate in the embodiments marked with (■) are of Ir (75 nm)/CSBT (x=0.2, 135)/$HfO_2$ (4 nm)/Si. The preferred temperature conditioned for ferroelectric crystallization annealing is not less than 730 degrees C. and not more than 800 degrees C., yielding memory window of not less than 0.4 volts.

Examples using embodiments of metal 4 other than Ir are shown in Table 4. In Examples 22A, 22B, 22C, 19E, 19B and 19C, Pt is used for metal 4. In those except Example 19, the memory window is not less than 0.40 volts. The volume proportion of oxygen gas to nitrogen gas varies from each other of the six Examples. Annealing at a temperature of 700 to 800 degrees C. in pure nitrogen not containing oxygen is found to cause Pt to come off or be detached. Note is taken of Examples in which oxygen is less contained, that is, y is small. In Example 19E where y=0.0003, $I_d$-$V_g$ characteristic is obtainable, but there is much damage in Pt. In Examples of x=0.0001 tried, a keen detachment of Pt makes it impossible to measure $I_d$-$V_g$. In Example 22C where y=0.0007 which has practically no problem, an inspection with a FeSEM (field emission scanning electron microscope) indicates that Pt tends to break off. With Ir, annealing at 700 to 800 degrees C. in pure nitrogen produces no such detachment or breakage. Note then Examples 14A and 14B in which metal 4 is an alloy of Ir and Pt alloyed at 1:1 in weight and formed by the sputtering technique. In Example 14B of y=0.0004, no detachment of the metal is observed, but in Example A, a little breakage of the metal is seen. In Example 17C in which the metal is Ru, no breakage is observed of Ru that is annealed under y=0.0005.

Figure 17:
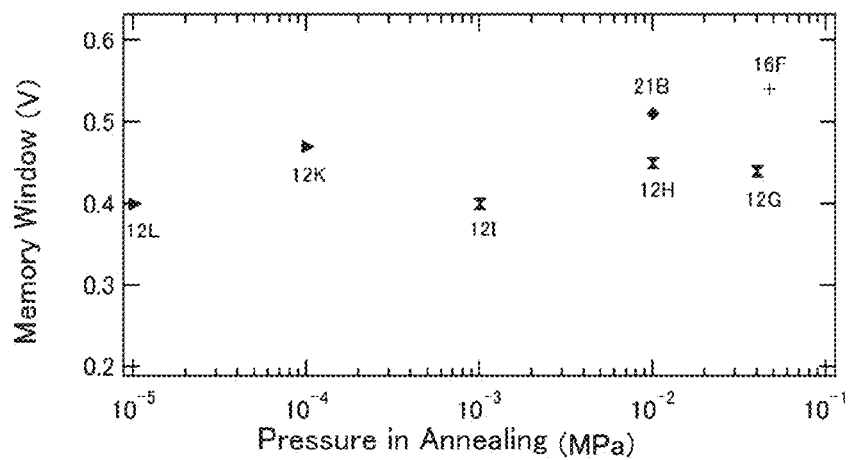
FIG. 17 It is a graph in summary of Examples of the invention in which annealing for ferroelectric crystallization is performed in the environment of a pressure lower than one atmospheric pressure in accordance with the present invention.

In the Examples hereinbefore disclosed, annealing for ferroelectric crystallization is effected under one atmospheric pressure (1 atm). Annealing for ferroelectric crystallization is also effected in an environment of a reduced pressure, that is, a pressure lower than 1 atm. Their results are put together in FIG. 17 and Table 2 and 3. Adjacent to the marks in the Figure are denoted the names of the Examples in which the annealing conditions in detail can be confirmed in Tables 2 and 3. In Examples 12G, 12H, 12I, 21B and 16F, annealing is carried out in a mixed gas having oxygen mixed with nitrogen at a volume proportion of y=0.001. The pressure under which annealing is effected can be read out from FIG. 17 and Table 2. As seen from FIG. 17 and Table 2, the pressure condition of not less than 1 atm and not more than 0.001 MPa is preferred to achieve a memory window of not less than 0.4 volt.

After iterated investigations, it has been found that in annealing for ferroelectric crystallization it is also effective to use oxygen alone as the gas while reducing its pressure. As disclosed in FIG. 17 and Examples 12L and 12k noted in Table 3, note that if the pressure of oxygen alone as the gas introduced is not less than $10^{-5}$ MPa (namely 10 Pa) and not more than $10^{-4}$ MPa (namely 100 Pa), that is preferred to yield a memory window of 0.4 volts. Brining about such an environment of reduced pressure is deemed important in order to reduce the extent in which to form an interfacial layer mainly composed of $SiO_2$ and to furnish necessary oxygen for annealing of a ferroelectric as an oxide, thereby constituting a favorable annealing condition.

Figure 18:
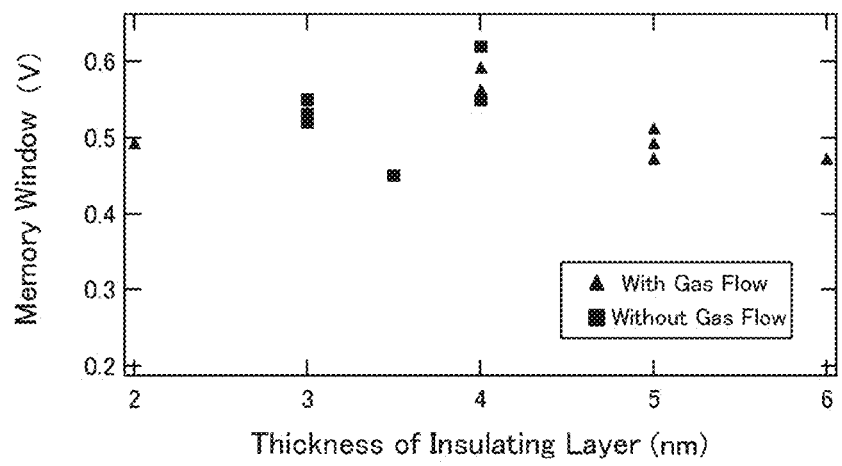
FIG. 18 It is a graph illustrating a relationship between a thickness of HfO$_2$ used for the insulator 2 and a memory window, according to the present invention.

FIG. 18 is a graph illustrating a relationship between a thickness of $HfO_2$ used for the insulator 2 and a memory window. The marks in Figure individually represent embodiments of FeFET made. Embodiments of marks (■) are the case that annealing is effected in the absence of a gaseous flow. Embodiments indicated by marks (▲) in FIG. 15 are the case that annealing is effected in the presence of the gaseous flow. The structure and thickness of a gate laminate in the embodiments marked with (■) are of Ir (75 nm)/ CSBT (x=0.2, 135)/$HfO_2$ (4 nm)/Si. The volume proportion of oxygen gas y=0.0001. FIG. 18 shows that the film of $HfO_2$ (4 nm) most preferably has a thickness of not less than 2 nm and not more than 6 nm.

For adjusting the $I_d$-$V_g$ characteristic for all the Fe FETs of the present invention described above, two additional annealing processes have been found out, each one of which is performed after all of process steps described above have been ended. The first process is to anneal in oxygen gas under a temperature condition lower than that in annealing for ferroelectric crystallization. The second process is to anneal in a gas containing hydrogen. The two characteristic adjustment annealing processes may be used in combination.

Figure 19:
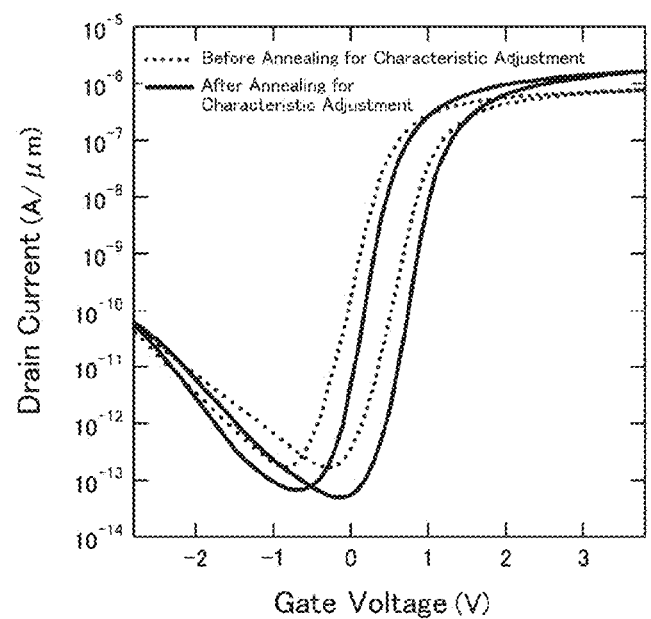
FIG. 19 It is a graph illustrating I$_d$-V$_g$ characteristics before and after annealing in a first process of characteristic adjustment annealing in Example 02B of the invention.
Figure 20:
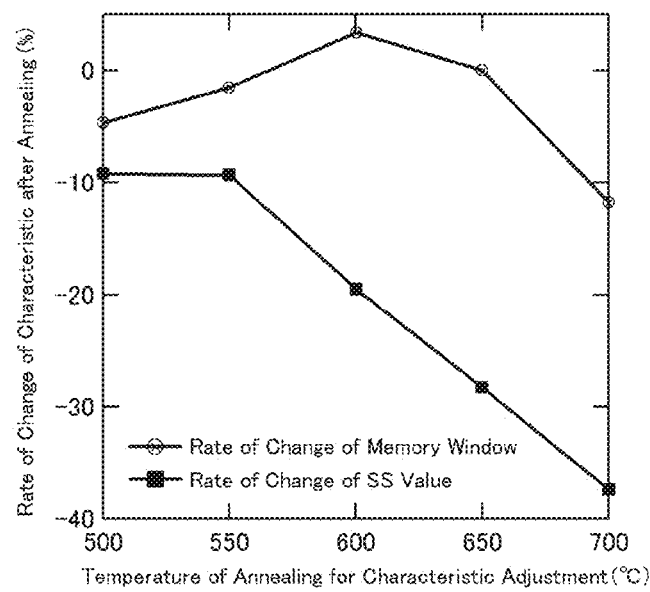
FIG. 20 It is a graph illustrating a relationship between an annealing temperature in the first process and a rate of change of memory window and a rate of change of SS value, according to the present invention.

In the first process, annealing is effected at a temperature of not less than 500 degrees C. and not more than 700 degrees C. for a time period of not less than 10 minutes and not more than 60 minutes. FIG. 19 discloses the $I_d$-$V_g$ characteristics of one FeFET on the chip in Example 02B before and after the characteristic adjustment annealing. The broken and solid curves represent them before and after the characteristic adjustment. It is seen that with respect to a change in the gate voltage the drain current evidently changes in a region of the gate voltage from to 1 volt, more sharply after the characteristic adjustment annealing than before the characteristic adjustment annealing. The characteristic is improved because of a larger change in current deemed in general better for a narrow change in voltage. Quantitatively, evaluation is made using an SS (sub-threshold swing) value. The SS value is defined as a gate voltage needed to change the drain current by one order of magnitude in a region of voltage lower than the threshold value, and it is better that the SS value is small. The SS value is found from the gradient of a curve at $I_d$=$10^{-10}$ A/micro-m. An average value of the SS value obtained from the hysteresis curves right and left is here adopted. Also, the memory window is evaluated at $I_d$=$10^{-8}$ A/micro-m. FIG. 19 (20) discloses the rate of change of the characteristic subsequent to annealing with respect to the temperature in the characteristic adjustment annealing. Marked with ○ are the rate of change of the memory window, and marked with ■ are the rate of change of the S value. Here, the rate of change is ([the physical quantity subsequent to annealing]−[the physical quantity prior to annealing])/[the physical quantity prior to annealing] and represented in percent (%). It is not good that the rate of the window subsequent to annealing decreases and it is good that the SS value decreases. As shown in FIG. 20, the rate of change of the memory window is small in a range of 500 to 700 degrees C. while the SS value diminishes largely as the temperature is risen. A decrease is seen in the SS value to the extent of 10% in the range of 500 to 700 degrees C. Since rise in temperature to an excess facilitates growth of an interfacial layer mainly composed of $SiO_2$ and decreases the memory window, resulting in a decrease in the memory window, the upper limit of annealing temperature in the first process is determined. Annealing in oxygen is deemed to recover a defect in the interface between the interfacial layer and Si.

Figure 21:
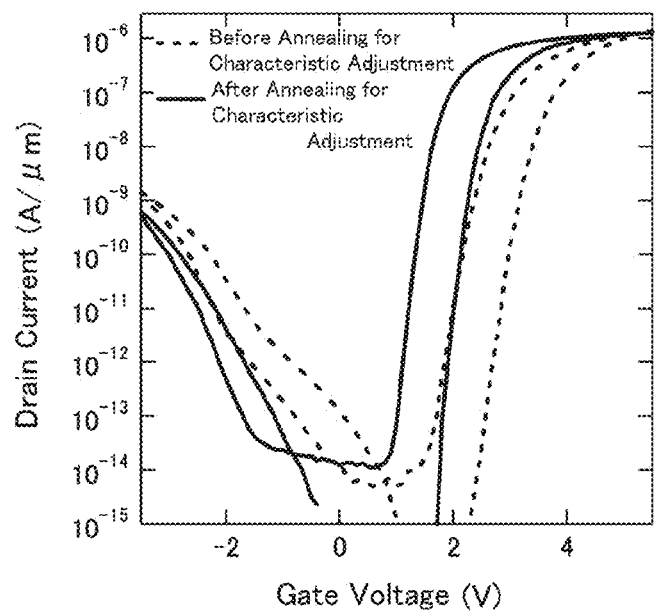
FIG. 21 It is a graph illustrating relationships between a drain current and a gate voltage after (solid curve), and between those before (broken curve), annealing in a second process of characteristic adjustment is performed at a temperature of 400 degrees C. and a time period of 30 minutes in Example 21C of the invention.
Figure 22:
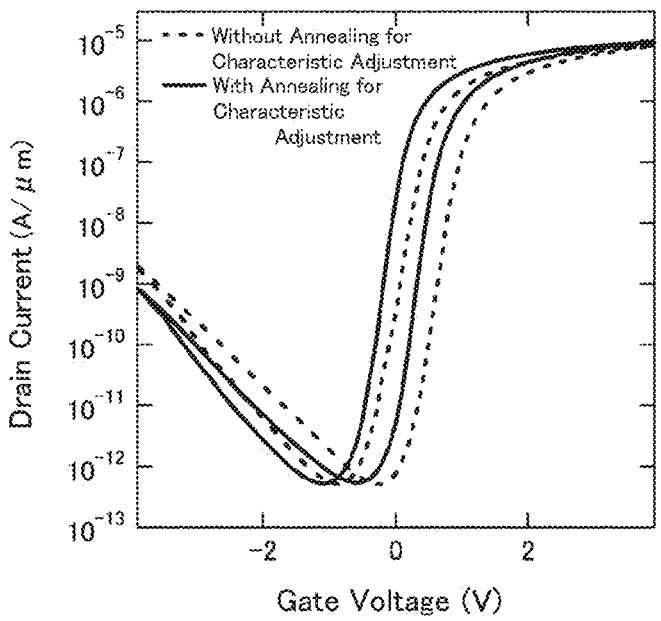
FIG. 22 It is a graph illustrating relationships between a drain current and a gate voltage after (solid curve), and between those before (broken curve), annealing in a second process of characteristic adjustment is performed at a temperature of 400 degrees C. and a time period of 5 minutes in Example 23C of the invention.

The second process makes use of a mixed gas of hydrogen and nitrogen, containing 3 to 5% of hydrogen. The annealing temperature is preferably not less than 350 degrees C. and not more than 450 degrees C. The annealing time period is preferably not less than 3 minutes and not more than 30 minutes. A clear effect of the second process can be seen from FIGS. 21 and 22. As regards FIG. 21 and Example 21, annealing is effected at a temperature of 40 degrees C. for a time period of 30 minutes. It is seen that "after annealing" (solid curve) is more sharply changed clearly with respect to a change in the gate voltage than "before annealing" (broken curve). FIG. 22 shows results of the second process of annealing a FeFET at a temperature of 400 degrees C. for a time period of 5 minutes, the FeFET being on the chip in Example 23C. As with FIG. 21, the effect of improvement is observed. A hydrogen atom coming into a dangling bond between Si and an interfacial layer 5 mainly composed of $SiO_2$ is deemed to decrease the state density in the interface, causing the effect of hydrogen annealing to be revealed. Inasmuch as a ferroelectric that is an oxide is decomposed at a higher temperature and for a longer period of time, the temperature and period of time are preferably as mentioned above.

Figure 23:
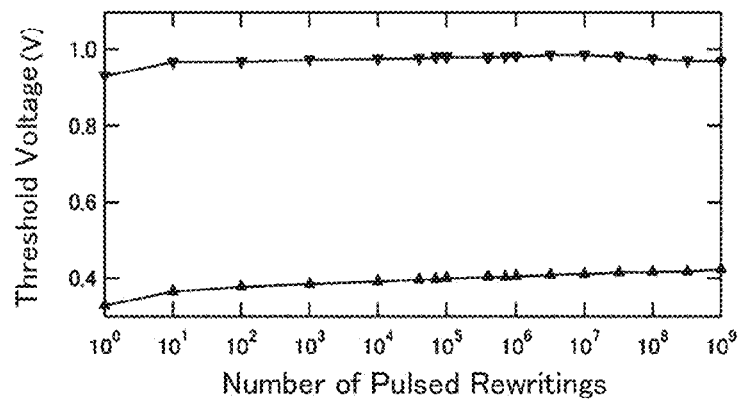
FIG. 23 It is a graph illustrating results of data rewrite withstand tests for Example 02B of the invention, using rewrite pulses alternating between −3.3 volts and +3.3 volts.
Figure 24:
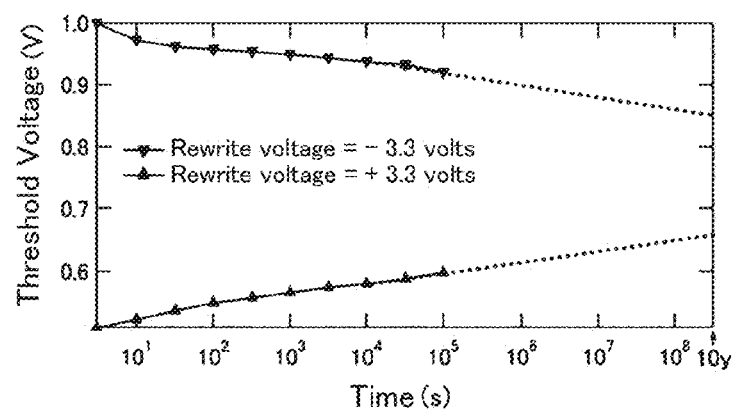
FIG. 24 It is a graph illustrating results of measurement of data retention property for Example 02B (with rewrite voltages of +3.3 volts) of the invention.

A pulse rewrite withstand property and a data retention capability are disclosed if the writing voltage has its absolute value of 3.3 volts. Use is made of a FeFET in Example 02B. An alternating pulse having a cycle of a negatively poled pulse having a height of −3.3 volts and a width of 10 microseconds followed by a positively poled pulse having a height of +3.3 volts and a width of 10 microseconds is repetitively applied, constituting rewriting pulses. Upon applying a given cumulative number of alternating pulses, the $I_d$-$V_g$ characteristic is measured to examine a rewriting tolerance. The gate voltage is swept in reciprocation between −3.3 and +3.3 volts. While the gate voltage is being swept, $V_d$=0.1 volt and $V_s$=$V_{sub}$=0 volt. As explained in FIG. 6 where $I_d$=$10^{-8}$ A/microsecond is imparted, two gate voltages (threshold voltages) are taken. Thereafter, alternating pulses are applied again. After a given cumulative number is reached, the $I_d$-$V_g$ characteristic is again measured to examine a rewriting tolerance. This is repeated to acquire a graph shown in FIG. 23. Marked with ▼ are values of threshold voltage obtained when the voltage is risen from −3.3 volts to +3.3 volts, and marked with ▲ are values of threshold voltage obtained when the voltage is sunk from −3.3 volts to +3.3 volts$_o$ From FIG. 23, it is seen that this embodiment has a rewriting tolerance or rewrite withstand capability of $10^9$ times or more. According to the techniques described in pant documents 1 and non-p references 4 and 5, the prior art has a rewrite withstand capability of $10^8$ times or more. FIG. 23 shows that FeFETs of the invention have values of the rewriting tolerance which are much not less than the equivalent of the prior art. As regards the data retention property, a state of data retention is entered upon applying a single negatively poled pulse having a height of −3.3 volts and a width of 0.1 second, and while the data is retained, $V_g$=$V_d$=$V_s$=$V_{sub}$=0 volt. At a point of time of each mark ▼, a readout operation is performed. While the data is being read out, let it be held that $V_d$=0.1 volt and $V_s$=$V_{sub}$=0 volts, and $V_g$ is swept from 1.0 volt to 0 volt to obtain an $I_d$-$V_g$ characteristic. $V_g$ applied to yield $I_d$=$10^{-8}$ A/micro-m represents a threshold value which is plotted in FIG. 24. After the data is retained for a given time interval, a readout operation is performed. By repeating this, results at marks ▼ in the Figure are obtained until $10^5$ seconds are lapsed after the pulse is written. A state of data retention is entered upon applying a single positively poled pulse having a height of −3.3 volts and a width of 0.1 second Results of the same readout operations are represented at marks ▼ in the Figure, showing a good data retention property. After $10^5$ seconds are lapsed, it is found that the threshold voltage following a negatively poled pulse is higher by about 0.31 than the threshold voltage following a positively poled pulse. The mark ▼ at after $10^4$ seconds and the marks ▼ at after $10^5$ seconds are connected by a straight line (broken line) and extrapolated up to 10 years. Likewise, the mark ▲ at after $10^4$ seconds and the marks ▲ at after $10^5$ seconds are connected by a straight line (broken line) and extrapolated up to 10 years. This extrapolating operation indicates that the difference in threshold voltage after 10 years remains to be about 0.18 volt, showing that two storage states are sufficiently distinguishable from each other. It thus follows that a data retention property equivalent to the data retention property described in patent documents 1 to 3 and non-p references 1 to 9 is met by the present invention. Note that the end of a data retention time period refers to a point of time at which two states are no longer distinguishable from each other. It is herein defined as a time at which the difference between the two threshold voltages reaches 0.05 volt. Note further that the data retention property can also be rated by a method whereby in readout the drain current is measured with the gate voltage fixed. In this case, that the ratio of on current to off current is 3 corresponds virtually to that the difference in threshold voltage is 0.05 volt. Thus, the end of a data retention time period is defined in a method of measuring a drain current by a time at which the ratio of on current to off current reaches 3. According to this definition, the life of data retention of embodiments of the present invention is enough in excess of 10 years. The present invention thus provides a FeFET capable of writing data with a writing voltage whose absolute value is not more than 3.3 volts, without impairing either of two properties which in combination are had by a FeFET which has been developed, the two properties being 1) a data retention property of not less than $10^5$ seconds and 2) a data rewrite withstand capability of $10^8$ times.

Figure 25:
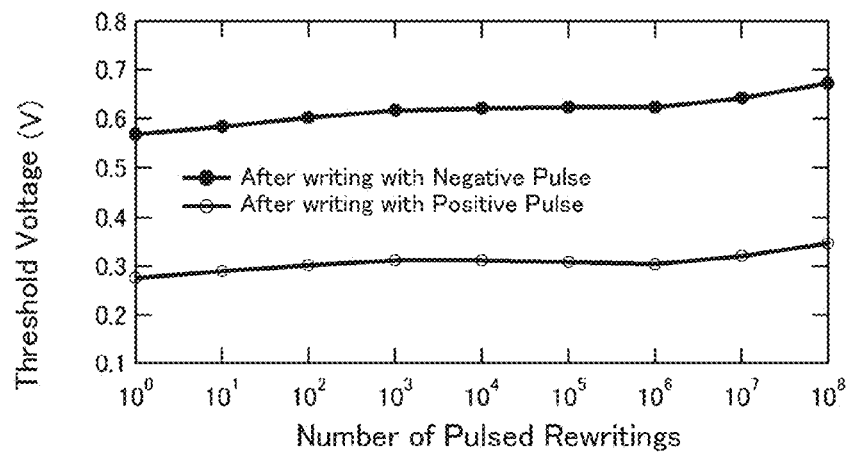
FIG. 25 It is a graph illustrating results of data rewrite withstand tests for Example 27E of the invention.
Figure 26:
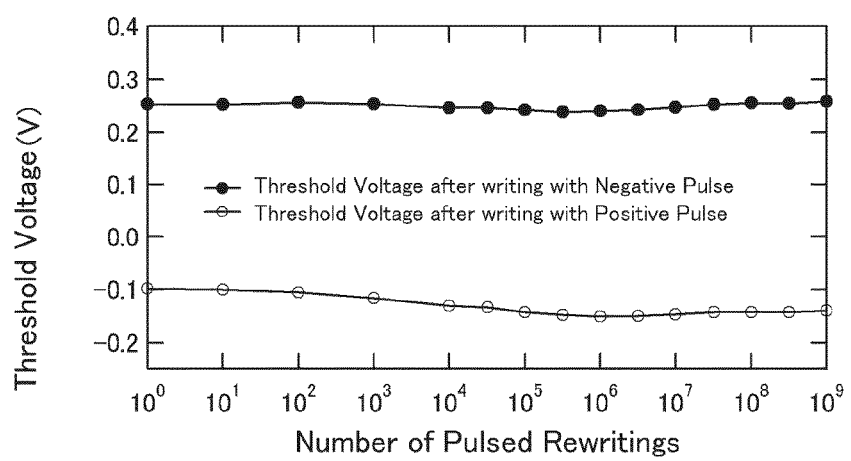
FIG. 26 It is a graph illustrating results of data rewrite withstand tests for Example 12H of the invention.

A Fe FET according to the present invention provides a good device property by a writing voltage even if its absolute value is in excess of 3.3 volts. FIGS. 25 and 26 show results of a data rewriting tolerance test. FIG. 25 is a graph having results from Example 27E. The gate laminate in Example 27E has a structure and thickness such as Ir (75 nm)/CSBT (x=0.2, 135)/HfO$_2$ (5 nm)/Si. Annealing for ferroelectric crystallization is effected in a mixed gas (in the presence of a gas flow under 1 atm) having oxygen mixed with nitrogen at a volume proportion of y=0.001, at a temperature of 800 degrees C. and for a time period of 30 minutes. An alternating pulse constituted in one cycle of a negatively poled pulse having a height of −4.5 volts and a width of 10 microseconds followed by a positively poled pulse having a height of +4.5 volts and a width of 10 microseconds is repetitively applied forming alternating pulses for rewriting. While rewriting alternating pulses are being applied, it is held that $V_d$=$V_s$=$V_{sub}$=0 volt. After a given cumulative number of alternating pulses are applied, a readout operation is performed. In the readout operation, first after writing with a negatively poled pulse of −4.5 volts high and 10 microseconds wide, the gate voltage is swept in a narrow range such that a threshold voltage can be measured. In this case, the gate voltage is swept from 0.9 volt to 0.1 volt. While the gate voltage is being swept, $I_d$ is measured with that $V_d$=0.1 volt and $V_s$=$V_{sub}$=0 volt. The gate voltage applied to yield $I_d$=$10^{-8}$ A/micro-m becomes a threshold voltage after the negatively poled pulse is applied. Next, after writing with a positively poled pulse of +4.5 volts high and 10 microseconds wide, the gate voltage is likewise swept from 0.9 volt to 0.1 volt to measure $I_d$ under the conditions of $V_d$=0.1 volt and $V_s$=$V_{sub}$=0 volt. The gate voltage applied to yield $I_d$=$10^{-8}$ A/micro-m becomes a threshold voltage after the positively poled pulse is applied. When this readout operation is ended, alternating pulses are applied again. When a given cumulative number is reached, the readout operation is again performed. This is repeated. In this ways is yielded the graph of FIG. 25. Results from FIG. 25 demonstrate that the present embodiment has a rewrite withstand capability of not less than $10^8$ times. It is known that A NAND flash memory made of a transistor having a floating gate has a rewrite withstand capability of, at most, not less than $10^5$ times. In comparison, it is a markedly better rewrite withstand capability.

FIG. 26 represents results from Example 12H. The gate laminate in Example 12H has a structure and thickness such as Ir (75 nm)/CSBT (x=0.2, 135)/HfO$_2$ (5 nm)/Si. Annealing for ferroelectric crystallization is effected in a mixed gas (in the presence of a gas flow) having oxygen mixed with nitrogen at a volume proportion of y=0.001, at a temperature of 750 degrees C. and for a time period of 30 minutes. The graph in FIG. 25 is obtained from measurement using the same process as those mentioned above. Only a portion that differs numerically is mentioned. An alternating pulse, for a cycle of 20 microseconds, constituted of a negatively poled pulse having a height of −4.5 volts and a width of 10 microseconds followed by a positively poled pulse having a height of +4.5 volts and a width of 10 microseconds is used. After a given cumulative number of the alternating pulses, a readout operation is performed. In reading out, the gate voltage is swept from 0.6 to −0.4 volt. FIG. 26 graphically shows a rewrite withstand capability not less than $10^9$ times.

Figure 27:
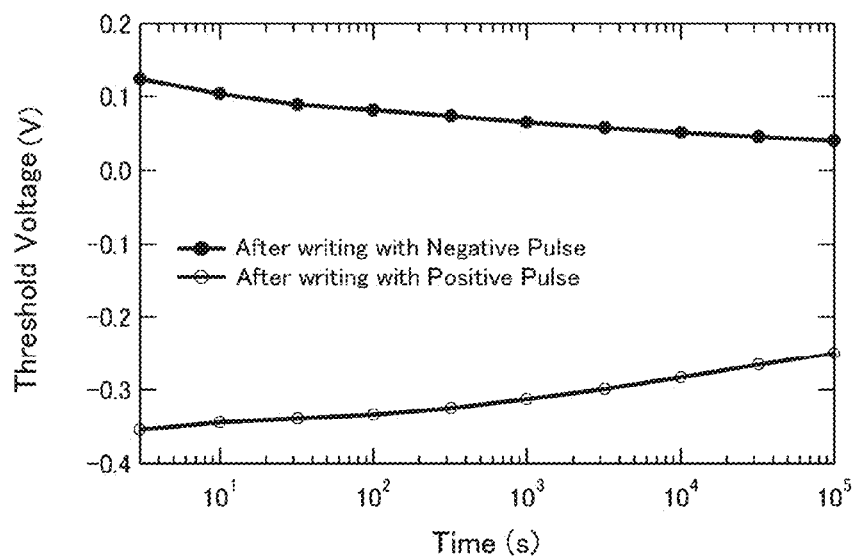
FIG. 27 It is a graph illustrating results of data rewrite withstand tests for Example 27F of the invention.
Figure 28:
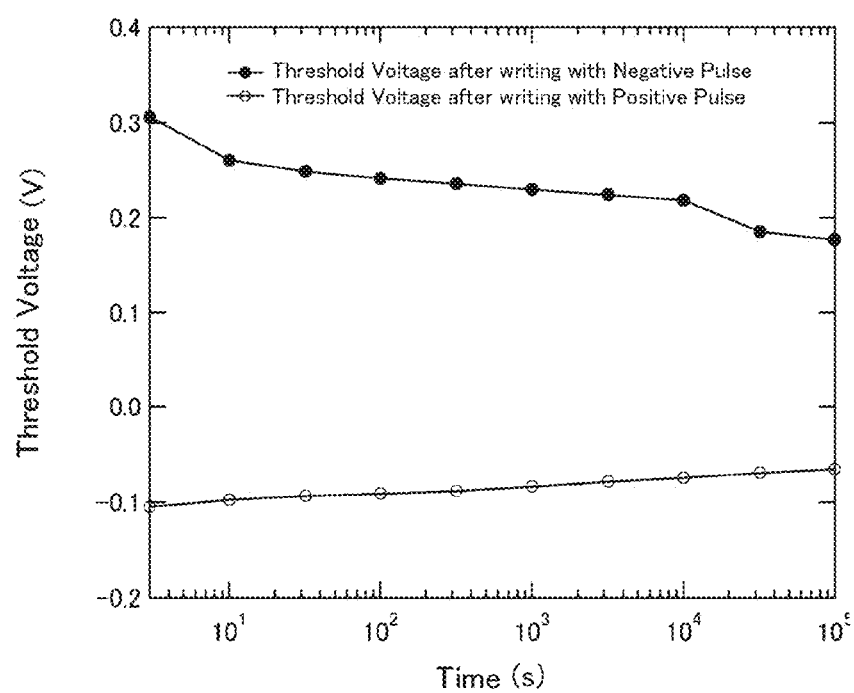
FIG. 28 It is a graph illustrating results of data rewrite withstand tests for Example 12H of the invention.

FIGS. 27 and 28 graphically show results of the data retention property. FIG. 27 represents results from Example 27F. The gate laminate in Example 27F has a structure and a thickness such as Ir (75 nm)/CSBT (x=0.2, 135)/HfO$_2$ (5 nm)/Si. Annealing for ferroelectric crystallization is effected in a mixed gas (in the presence of a gas flow under 1 atm) having oxygen mixed with nitrogen at a volume proportion of y=0.001, at a temperature of 750 degrees C. and for a time period of 30 minutes. After a single negatively poled pulse having a height of −4.5 volts and a width of 10 microseconds is applied, a state of data retention is entered. While the data is retained, it is held that $V_d=V_s=V_{sub}$=0 volt. At a point of time represented by the mark ●, an readout operation is performed. While the data is being read out, it is held that $V_d$=0.1 volt and $V_s=V_{sub}$=0 volt, and $V_g$ is swept from 0.3 volt to −0.4 volt to obtain an $I_d$-$V_g$ characteristic. $V_g$ applied to yield $I_d$=10$^{-8}$ A/micro-m represents a threshold value which is plotted in the graph of FIG. 27. After a single positively pulse having a height of 4.5 volts and a width of 10 microseconds is applied. A state of data retention is entered. Results of the data readout operation that is likewise performed are shown marked with ○. After a lapse of $10^5$ seconds, the threshold voltage following the negatively poled pulse is found to be larger by about 0.5 volt higher than the threshold voltage following the positively poled pulse. showing a good data retention property. FIG. 28 shows results from Example 12H. Thickness of a gate laminate and condition of annealing for ferroelectric crystallization of the Example 12H are as mentioned above. The negatively poled pulse for writing has a height of −4.5 volts and a width of 10 microseconds. The positively poled pulse for writing has a height of +4.5 volts and a width of 10 microseconds. While data is being retained, it is held that $V_g=V_d=V_s=V_{sub}$=0 volt. While the data is being read out, it is held that $V_d$=0.1 volt and $V_s=V_{sub}$=0 volts, and $V_g$ is swept from 0.6 volt to −0.4 volt to obtain an $I_d$-$V_g$ characteristic. $V_g$ applied to yield $I_d$=10$^{-8}$ A/micro-m represents a threshold value which is plotted in the graph of FIG. 28. After a lapse of $10^5$ seconds, the threshold voltage following the negatively poled pulse is found to be larger by about 0.25 volt higher than the threshold voltage following the positively poled pulse. showing a good data retention property. As shown by the embodiments in Example 12H, the FeFET provides both excellent data retention property and excellent data rewrite withstand capability at the same time.

While the method of making a FeFET according to the present invention can be implemented in various forms that are not limitative, mention is made of two Examples of them.

Example 302B

1. Preparation of Si Substrate and Surface Treatment

A source and a drain region are formed and a Si substrate of p-type covered with a SiO$_2$ surface layer having a thickness of 35 nm is prepared. The substrate is immersed in buffered hydrofluoric acid to remove the protective SiO$_2$ film on its surface, a state as shown in FIG. 29(a).

2. Forming an Insulator 2

A pulse laser deposition technique is used to form an insulator 2. Its target is HfO2 and the laser is KrF excimer laser, having a wavelength of 248 nm, a pulse projection number of 10 per second and a laser energy of 250 mJ. The substrate is held at a temperature of 220 degrees C., and N$_2$ is introduced at a rate of flow of 4 sccm and under a pressure of 15 Pa and for a time period of 8 minutes and 57 seconds. The insulator 2 is formed in the form of a film of HfO$_2$. Note that the rate of forming the film varying with the state of equipment and target is seized separately by a monitor. The film forming time is adjusted to give a selected film thickness.

3. Forming a Film 3a

A pulse laser deposition technique is used to form a film 3a. The target is Ca—Sr—Bi—Ta—O. Ca and Sr contained in the target are of molar ratio, Ca:Sr=0.2:0.8. Note that it is confirmed by Rutherford backscattering spectrometry that the molar ratio is held in a FeFET completed through annealing for ferroelectric crystallization. The laser is KrF excimer laser, having a wavelength of 246 nm, a pulse projection number of 50 per second and a laser energy of 250 mJ. The substrate is held at a temperature of 415 degrees C., and O$_2$ is introduced at a rate of flow of 3.1 sccm and under a pressure of 11 Pa and for a time period of 17 minutes and 47 seconds to form a film 3a. The film 3a formed is of Ca—Sr—Bi—Ta—O. Note that the rate of forming the film varying with the state of equipment and target is seized separately by a monitor. The film forming time is adjusted to give a selected film thickness.

4. Forming a Metal 4

An Rf magnetron scattering technique is used to form a metal 4. The target is metal Ir and the substrate is not heated. Argon is introduced at a rate of flow of 1.4 sccm and under a pressure of 0.15 Pa. Rf power is 40 W and held for 22 minutes and 30 seconds to form a film of Ir having a thickness of 75 nm, as the metal. Past process steps 2, 3 and 4, a state as shown in FIG. 29(b) is had.

5. Forming a Gate Metal Configuration (1) Photolithographic Process Step

A photoresist of the gate configuration is left by an ordinary photographic technique. FeFETs of 8 kinds have a gate length of 10 micrometers and a gate width of 200 to 10 micrometers (2) Etching of Metal 4

An ion milling technique is used to remove portions of Ir metal which are not covered with the photoresist.

(3) Removal of the Photoresist

The Example specimen is immersed in acetone to remove the photoresist, the specimen being thereafter cleansed in ultrapure water, bringing about a state as shown in FIG. 29c).

6. Annealing for Ferroelectric Crystallization

An infrared gold-image furnace is used to perform annealing for ferroelectric crystallization. The furnace vessel having the Example specimen set is evacuated to vacuum. Then, after a gas containing oxygen and nitrogen is introduced while a volume proportion thereof is maintained at y=0.001 into the furnace vessel, the gas introduction is halted. The Example specimen has a temperature risen from room temperature to 750 degrees C. for a time period of 10 minutes and is annealed at the temperature of 750 degrees C. under a pressure of 1 atm in the absence of flow for a time period of 30 minutes.

7. Forming a Hole for Contact of Source and Drain (1) Photolithographic Process Step An ordinary photolithographic technique is used to remove the resist at a portion of the hole for contact of the source and drain.

(2) Etching Process Step

An ion milling technique is used to remove portions of the ferroelectric and insulator 2.

(3) Removal of the Photoresist

The Example specimen is immersed in acetone to remove the photoresist.

Figure 29:
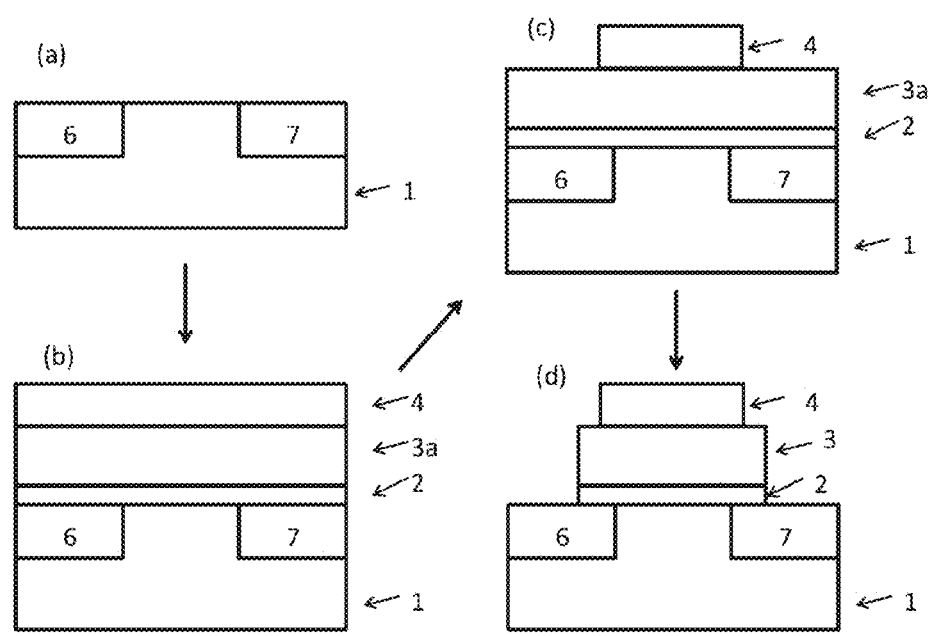
FIG. 29 It is an explanatory view illustrating a process of making an Example 302B of the invention.

Past this process step, a state as shown in FIG. 29($d$) is reached, making it possible to measure an $I_d$-$V_g$ characteristic and others. The process step of annealing for ferroelectric crystallization is effected intervening between the process steps of FIGS. 29($c$) and 2($d$), transforming the film 3a in FIG. 29($c$) into a ferroelectric 3. Note, further, that the interfacial layer 5 mainly composed of SiO$_2$ is omitted from illustration.

The two sorts of annealing may be performed at need and after process steps 6 and 7.

Example 12B (1) Preparation of Si Substrate 1 and Surface Treatment, (3) Forming a Film 3a, (4) Forming a Metal 4, (5) Forming a Gate Metal Configuration and (7) Forming a Hole for contact of Source and Drain are the same as in Example 302B. However, in (3) Forming a Film 3a, the time period for film forming is varied in view of a change in rate of film forming. Also, (6) Annealing for Ferroelectric Crystallization is the same as in Example 302B, except that the annealing temperature is changed to 780 degrees C.

In (2) Forming an Insulator 2, this Example has hafnium nitride (Hf—N) formed having a thickness of 2 nm and thereafter HfO$_2$ formed having a thickness of 4 nm. Forming of HfO$_2$ is the same as in Example 302B. However, the time period for film forming is varied in consideration of a change in rate of film forming.

Mention is here made of forming a film of hafnium nitride (Hf—N) in detail. A film of hafnium nitride (Hf—N) is formed using a metal organic chemical vapor deposition technique of the type in which a raw material liquid solution is prepared having a complex compound containing Hf and dissolved in a solvent, the raw material liquid solution being dispersed into a carrier gas to form a raw material gaseous medium in a state of gas and liquid two phases; the raw material gaseous medium while in the state of gas and liquid two phases is introduced into a vaporizing chamber to form a vapor thereof and the vapor is introduced into a film forming chamber.

The complex compound containing Hf is preferably Hf[N(C$_2$H$_5$)(CH$_3$)]$_4$, tetrakis-dimethyl amino hafnium, which is abbreviated as TEMAHF. It can be confirmed that a complex compound expressed by chemical formula: Hf[N(C$_2$H$_5$)$_2$]$_4$, tetrakis diethylamido hafnium abbreviated as TDEAHF can also be used to form a film of Hf—N. For the solvent, use is made of ethyl cyclohexane (ECH). The carrier gas uses nitrogen gas, but may be argon gas. Ammonia (NH$_3$) gas is also introduced in to the growth chamber. It is important that a preferred rate of flow of NH$_3$ gas be selected. Further, It is necessary that the temperature of a susceptor holding the substrate (i.e. an Example specimen being made) be suitably selected. In the raw material liquid solution having TEMAHF dissolved in ECT, the concentration of TEMAHF in ECT is preferably 0.1 mol to 0.2 mol per liter. In the raw material liquid solution, to, having TDEAHF dissolved in ECT, the concentration of TDEAHF in ECT is preferably 0.1 mol to 0.2 mol per liter. The rate of liquid flow of the raw material liquid solution is preferably 0.1 to ccm to 0.3 ccm. The pressure of the growth chamber is 200 Pa to 700 Pa. While the rate of NH$_3$ gas is not less than 5 sccm and not more than 30 sccm, and the susceptor temperature is not less than 260 degrees C. and not more than 400 degrees C., it has been found that they are preferable to form a film of hafnium nitride satisfying a stoichiometric mixture ratio of Hf$_3$N$_4$. When under the conditions a film of Hf—N having a thickness of 35 nm is formed on the test specimen not of FeFET (but a silicon wafer) and its composition is analyzed by the Rutherford backscattering spectroscopic technique, the ratio in number of atoms of Hf and N, [number of N atoms]/[number of Hf atoms], is found to be =1.36. This shows that the composition of hafnium nitride formed into a film according to the present invention is close to the composition of hafnium nitride (4/3=1.33) known in chemical formula of Hf$_3$N$_4$.

EXPLANATION OF REFERENCE CHARACTERS

1 a semiconductor substrate
2 an insulator
3a a film a
3 a ferroelectric
4 a metal
an interfacial layer (IL) mainly composed of SiO$_2$
6 a source region
7 a drain region

TABLE 1

Making Conditions of FeFET with a Gate Laminate of Ir (75 nm)/CSBT (x = 0.2)/HfO$_2$ (5 nm)/Si, and Memory Window therein

| | Making Conditions of Hf—N | | | CSBT | | Annealing for Ferroelectric Crystallization | | | |
|---|---|---|---|---|---|---|---|---|---|
| Example Name | NH$_3$ Flow Rate (sccm) | Susceptor temperature (° C.) | Thickness (nm) | HfO$_2$ Thickness (nm) | (x = 1) Thickness (nm) | Gaseous Flow ○ or X | Oxygen Vol. Prop. y | Temp. (° C.) | Memory Window |
| 11A | 9 | 260 | 1 | 3 | 135 | X | 0.001 | 780 | 0.54 |
| 11B | 9 | 260 | 1 | 3 | 135 | X | 0.001 | 780 | 0.47 |
| 11C | 9 | 260 | 1.5 | 3 | 135 | X | 0.001 | 780 | 0.51 |
| 11D | 9 | 260 | 1.5 | 4 | 135 | X | 0.0005 | 780 | 0.42 |
| 12A | 9 | 260 | 2 | 3 | 135 | X | 0.001 | 780 | 0.5 |
| 12B | 9 | 260 | 2 | 4 | 135 | X | 0.001 | 780 | 0.57 |
| 04A | 20 | 260 | 1 | 3 | 135 | X | 0.001 | 780 | 0.53 |
| 04B | 20 | 260 | 1 | 4 | 135 | X | 0.0005 | 780 | 0.54 |

TABLE 1-continued

Making Conditions of FeFET with a Gate Laminate of Ir (75 nm)/CSBT
(x = 0.2)/HfO$_2$ (5 nm)/Si, and Memory Window therein

| Example Name | Making Conditions of Hf—N | | | HfO$_2$ Thickness (nm) | CSBT (x = 1) Thickness (nm) | Annealing for Ferroelectric Crystallization | | | Memory Window |
|---|---|---|---|---|---|---|---|---|---|
| | NH$_3$ Flow Rate (sccm) | Susceptor temperature (° C.) | Thickness (nm) | | | Gaseous Flow ◯ or X | Oxygen Vol. Prop. y | Temp. (° C.) | |
| 04C | 20 | 260 | 1.5 | 3 | 135 | X | 0.001 | 780 | 0.53 |
| 05A | 20 | 260 | 2 | 4 | 135 | X | 0.001 | 780 | 0.56 |
| 23A | 20 | 400 | 1 | 4 | 135 | X | 0.001 | 780 | 0.47 |
| 24A | 20 | 400 | 1.5 | 4 | 135 | X | 0.001 | 780 | 0.43 |

TABLE 2

Conditions of Examples in which Annealing is effected in a Mixed Gas of
Nitrogen and Oxygen under a Reduced Pressure, and Memory Window therein

| Example Name | I Layer HfO$_2$ Thickness (nm) | F Layer CSBT (x = 2) Thickness (nm) | M Layer Ir Thickness (nm) | Temp. in Annealing T$_{an}$ (° C.) | Gas Flow in Annealing ◯ or X | Oxygen Vol. Prop. To Nitrogen in Annealing | Pressure in Annealing (MPa) | Memory Window |
|---|---|---|---|---|---|---|---|---|
| 12G | 5 | 135 | 75 | 750 | ◯ | 0.001 | 0.04 | 0.44 |
| 12H | 5 | 135 | 75 | 750 | ◯ | 0.001 | 0.01 | 0.45 |
| 12I | 5 | 135 | 75 | 750 | ◯ | 0.001 | 0.001 | 0.40 |
| 21B | 4 | 135 | 75 | 780 | ◯ | 0.001 | 0.001 | 0.51 |
| 16F | 4 | 135 | 75 | 780 | X | 0.001 | 0.0475 | 0.54 |

TABLE 3

Conditions of and Memory Window in Examples In which Annealing is effected under a Reduced Pressure

| Example Name | I Layer HfO$_2$ Thickness (nm) | F Layer CSBT (x = 2) Thickness (nm) | M Layer Ir Thickness (nm) | Temp. in Annealing T$_{an}$ (° C.) | Gas Flow in Annealing ◯ or X | Oxygen Vol. Prop. To Nitrogen in Annealing | Pressure in Annealing (MPa) | Memory Window |
|---|---|---|---|---|---|---|---|---|
| 12K | 5 | 135 | 75 | 750 | ◯ | | | |
| 12L | 5 | 135 | 75 | 750 | ◯ | | | |

TABLE 4

Examples using Pt, IrPt and Ru for Metal

| Example Name | Insulator HfO2 Thickness (nm) | Ferroelectric CSBT X = 0.2 (nm) | Metal | | | Annealing for Ferroelectric Crystallization | | | Memory Window |
|---|---|---|---|---|---|---|---|---|---|
| | | | Material Type | Technique for Deposition | Thickness (nm) | Gaseous Flow ◯ or X | Oxygen Vol. Prop. Y | Temp. (° C.) | |
| 22A | 4 | 135 | Pt | Electron Beam Depo. | 150 | ◯ | 0.003 | 780 | 0.46 |
| 22B | 4 | 135 | Pt | Electron Beam Depo/ | 150 | ◯ | 0.006 | 780 | 0.40 |
| 22C | 4 | 135 | Pt | Electron Beam Depo. | 150 | ◯ | 0.0007 | 780 | 0.42 |
| 19E | 5 | 135 | Pt | Electron Beam Depo. | 150 | ◯ | 0.0003 | 780 | 0.30 |
| 19B | 5 | 135 | Pt | Electron Beam Depo. | 150 | ◯ | 0.001 | 780 | 0.49 |
| 19C | 5 | 135 | Pt | Electron Beam Depo. | 150 | ◯ | 0.01 | 780 | 0.40 |
| 14A | 4 | 146 | IrPt alloy | Spattering | 75 | ◯ | 0.0001 | 780 | 0.56 |
| 14B | 4 | 146 | IrPt alloy | Spattering | 75 | ◯ | 0.0004 | 780 | 0.49 |
| 17C | 4 | 135 | Ru | Spattering | 70 | ◯ | 0.0005 | 740 | 0.40 |

The invention claimed is:

1. A method of making a semiconductor ferroelectric memory transistor comprising a semiconductor substrate having a source region and a drain region; and an insulator, a ferroelectric, and a metal which are layered in this order on the semiconductor substrate, the insulator having an electron affinity smaller than an electron affinity of the ferroelectric, the insulator having an ionization potential larger than an ionization potential of the ferroelectric, the ferroelectric layer comprising a bismuth perovskite ferroelectric, the ferroelectric layer having a thickness of more than 59 nm and less than 150 nm, the semiconductor ferroelectric memory transistor having a characteristic that a memory window of a hysteresis curve drawn by a drain current and a gate voltage is 0.40 V or more when the gate voltage is swept in reciprocation and a sweep amplitude of the gate voltage is not more than 3.30 V, the method comprising:

sequentially forming the insulator on the semiconductor substrate having the source region and the drain region, the insulator having the electron affinity smaller than the electron affinity of said ferroelectric, said insulator having the ionization potential larger than the ionization potential of the ferroelectric;

forming a ferroelectric precursor layer of the bismuth layer perovskite ferroelectric composed of strontium, bismuth, tantalum and oxygen, composed of calcium, strontium, bismuth, tantalum and oxygen, composed of strontium, bismuth, tantalum, niobium and oxygen, or composed of calcium, strontium, bismuth, tantalum, niobium and oxygen;

forming the metal on the ferroelectric precursor layer composed of a metal selected from the group consisting of Ir, Pt, and an alloy of Ir and Pt, by which a stack of the metal, the ferroelectric precursor, the insulator, and the semiconductor substrate is sequentially formed; and performing an annealing of the stack by which the ferroelectric precursor layer is changed to the bismuth layer perovskite ferroelectric and an electrically insulating interfacial layer is grown between the semiconductor substrate and the insulator, wherein the annealing is performed in a mixed gas of nitrogen and oxygen with the mixed gas comprising predominantly nitrogen to limit growth of the electrically insulating interfacial layer to a thickness of less than 3.4 nm, wherein, when the metal is Ir, the annealing is performed in the mixed gas comprising a volume proportion of oxygen to nitrogen that is at least 0.0002 and at most 0.02, wherein, when the metal is Pt, the annealing is performed in the mixed gas comprising a volume proportion of oxygen to nitrogen that is greater than 0.0007 and at most 0.01, and wherein, when the metal is the alloy of Ir and Pt, annealing is performed in the mixed gas comprising a volume proportion of oxygen to nitrogen that is greater than 0.0001 and at most 0.0004.

2. The method of making the semiconductor ferroelectric memory transistor according to claim 1, wherein the annealing is performed at a temperature of not less than 730 degrees C. and not more than 800 degrees C.

3. The method of making the semiconductor ferroelectric memory transistor according to claim 1, wherein the sweep amplitude is not less than 2.7 V.

4. The method of making the semiconductor ferroelectric memory transistor according to claim 1, wherein memory transistor has a data retention property, in which a voltage difference between a threshold voltage at the time when $10^5$ seconds have passed after writing of a negative pulse, and a threshold voltage at the same time have passed after writing of the positive pulse is 0.25 V or more.

5. The method of making the semiconductor ferroelectric memory transistor according to claim 4, a ratio of the voltage difference at the time when 10 seconds have passed after the writings of negative pulse and positive pulse is 0.66 times or more.

6. The method of making the semiconductor ferroelectric memory transistor according to claim 1, wherein the memory transistor has a data rewrite endurance property of $10^8$ or more cycles.

7. The method of making the semiconductor ferroelectric memory transistor according to claim 6, wherein the endurance property is characterized by passing two criteria by a rewrite endurance-cycle test, every time after providing a predetermined cycle with a positive/negative alternating write pulse, the rewrite endurance-cycle test collects a threshold voltage VTHp after writing by a positive write pulse, and a threshold voltage Vthn after writing by a negative write pulse, and forms a Vthn data group and a Vthp data group, and one criterion of the two criteria is that a difference voltage obtained by the minimum voltage of the Vthn data group subtracted by the maximum voltage of the Vthp data group is 0.22 V or more, and the other criterion of the two criteria is that a ratio of said difference voltage to another different voltage obtained by that the maximum voltage of the Vthn data group subtracted by the minimum voltage of the Vthp data group is 0.55 or more.

* * * * *